United States Patent
Rueckes et al.

(10) Patent No.: US 9,281,185 B2
(45) Date of Patent: Mar. 8, 2016

(54) METHODS FOR PASSIVATING A CARBONIC NANOLAYER

(71) Applicant: Nantero Inc., Woburn, MA (US)

(72) Inventors: Thomas Rueckes, Byfield, MA (US); H. Montgomery Manning, Eagle, ID (US); Rahul Sen, Lexington, MA (US)

(73) Assignee: Nantero Inc., Woburn, MA (US)

( * ) Notice: Subject to any disclaimer, the term of this patent is extended or adjusted under 35 U.S.C. 154(b) by 0 days.

(21) Appl. No.: 14/535,675

(22) Filed: Nov. 7, 2014

(65) Prior Publication Data

US 2015/0064886 A1 Mar. 5, 2015

Related U.S. Application Data

(60) Continuation of application No. 14/020,095, filed on Sep. 6, 2013, now Pat. No. 8,895,950, which is a division of application No. 12/910,714, filed on Oct. 22, 2010, now Pat. No. 8,551,806.

(60) Provisional application No. 61/254,588, filed on Oct. 23, 2009.

(51) Int. Cl.
*H01L 29/04* (2006.01)
*H01L 47/00* (2006.01)
(Continued)

(52) U.S. Cl.
CPC ........... *H01L 21/02527* (2013.01); *B82Y 10/00* (2013.01); *H01L 21/02606* (2013.01);
(Continued)

(58) Field of Classification Search
CPC ..................... H01L 21/02203; H01L 29/1606; H01L 45/608

USPC ........... 438/500; 977/745, 749, 762, 764, 779
See application file for complete search history.

(56) References Cited

U.S. PATENT DOCUMENTS

| | | | |
|---|---|---|---|
| 6,057,637 | A | 5/2000 | Zettl |
| 6,277,318 | B1 | 8/2001 | Bower |

(Continued)

FOREIGN PATENT DOCUMENTS

| | | |
|---|---|---|
| GB | 2364933 | 2/2002 |
| JP | 11008690 | 1/1999 |

(Continued)

OTHER PUBLICATIONS

Ago, et al., "Workfunction of Purified and Oxidized Carbon Nanotubes," Synthetic Metals, vol. 103, 1999, pp. 2494-2495.

(Continued)

*Primary Examiner* — Karen Kusumakar
(74) *Attorney, Agent, or Firm* — Nantero Inc.

(57) ABSTRACT

Methods for passivating a nanotube fabric layer within a nanotube switching device to prevent or otherwise limit the encroachment of an adjacent material layer are disclosed. In some embodiments, a sacrificial material is implanted within a porous nanotube fabric layer to fill in the voids within the porous nanotube fabric layer while one or more other material layers are applied adjacent to the nanotube fabric layer. Once the other material layers are in place, the sacrificial material is removed. In other embodiments, a non-sacrificial filler material (selected and deposited in such a way as to not impair the switching function of the nanotube fabric layer) is used to form a barrier layer within a nanotube fabric layer. In other embodiments, individual nanotube elements are combined with and nanoscopic particles to limit the porosity of a nanotube fabric layer.

18 Claims, 38 Drawing Sheets

(51) Int. Cl.

| | |
|---|---|
| H01L 29/00 | (2006.01) |
| H01L 21/02 | (2006.01) |
| H01L 29/16 | (2006.01) |
| H01L 51/00 | (2006.01) |
| H01L 51/10 | (2006.01) |
| H01L 29/06 | (2006.01) |
| B82Y 10/00 | (2011.01) |
| H01L 51/05 | (2006.01) |
| H01L 29/10 | (2006.01) |
| B82Y 40/00 | (2011.01) |

(52) U.S. Cl.
CPC ...... *H01L21/02628* (2013.01); *H01L 29/0665* (2013.01); *H01L 29/1606* (2013.01); *H01L 51/0003* (2013.01); *H01L 51/0048* (2013.01); *H01L 51/107* (2013.01); *B82Y 40/00* (2013.01); *H01L 21/02203* (2013.01); *H01L 29/0669* (2013.01); *H01L 29/1029* (2013.01); *H01L 51/0591* (2013.01); *Y10S 977/842* (2013.01)

(56) References Cited

U.S. PATENT DOCUMENTS

| | | |
|---|---|---|
| 6,342,276 B1 | 1/2002 | You |
| 6,409,567 B1 | 6/2002 | Amey, Jr. et al. |
| 6,423,583 B1 | 7/2002 | Avouris et al. |
| 6,495,116 B1 | 12/2002 | Herman |
| 6,495,258 B1 | 12/2002 | Chen et al. |
| 6,515,339 B2 | 2/2003 | Shin et al. |
| 6,528,020 B1 | 3/2003 | Dai et al. |
| 6,630,772 B1 | 10/2003 | Bower et al. |
| 6,645,628 B2 | 11/2003 | Shiffler, Jr. et al. |
| 6,706,402 B2 | 3/2004 | Rueckes et al. |
| 6,707,098 B2 | 3/2004 | Hofmann et al. |
| 6,808,746 B1 | 10/2004 | Dai et al. |
| 6,833,558 B2 | 12/2004 | Lee et al. |
| 6,835,591 B2 | 12/2004 | Rueckes et al. |
| 6,858,197 B1 | 2/2005 | Delzeit |
| 6,863,942 B2 | 3/2005 | Ren et al. |
| 6,888,773 B2 | 5/2005 | Morimoto |
| 6,890,780 B2 | 5/2005 | Lee |
| 6,899,945 B2 | 5/2005 | Smalley et al. |
| 6,905,892 B2 | 6/2005 | Esmark |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 7,057,402 B2 | 6/2006 | Cole et al. |
| 7,335,395 B2 | 2/2008 | Ward et al. |
| 7,375,369 B2 | 5/2008 | Sen et al. |
| 2001/0004979 A1 | 6/2001 | Han et al. |
| 2002/0160111 A1 | 10/2002 | Sun et al. |
| 2003/0004058 A1 | 1/2003 | Li et al. |
| 2003/0122111 A1 | 7/2003 | Glatkowski |
| 2003/0176034 A1* | 9/2003 | Jackson et al. ............... 438/237 |
| 2003/0177450 A1 | 9/2003 | Nugent |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0132070 A1 | 7/2004 | Star et al. |
| 2004/0181630 A1 | 9/2004 | Jaiprakash et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0095938 A1 | 5/2005 | Rosenberger et al. |
| 2005/0212014 A1 | 9/2005 | Horibe et al. |
| 2006/0204427 A1 | 9/2006 | Ghenciu et al. |
| 2006/0237537 A1 | 10/2006 | Empedocles |
| 2007/0004191 A1 | 1/2007 | Gu et al. |
| 2010/0245029 A1* | 9/2010 | Schricker et al. ............... 338/13 |

FOREIGN PATENT DOCUMENTS

| | | |
|---|---|---|
| JP | 11210336 | 7/1999 |
| JP | 2002258885 | 4/2002 |
| WO | WO-98/39250 | 9/1998 |
| WO | WO-99/65821 | 12/1999 |
| WO | WO-01/03208 | 1/2001 |
| WO | WO-02/45113 | 6/2002 |
| WO | WO-02/48701 | 6/2002 |
| WO | WO-03/016901 | 2/2003 |
| WO | WO-03/034142 | 4/2003 |

OTHER PUBLICATIONS

Ajayan, et al., "Applications of Carbon Nanotubes," Topics Appl. Phys., vol. 80, 2001, pp. 391-425.

Amblard, G., "Development and characterization of carbon nanotube processes for NRAM technology," Proc. of SPIE 2011, vol. 7970, pp. 797017-1-797017-7.

Awano, Y., "Graphene for VLSI: FET and Interconnect Applications," IEDM 2009 Technical Digest, pp. 10.1.1-10.1.4.

Banerjee, et al., "Functionalization of Carbon Nanotubes with a Metal-Containing Molecular Complex," Nano Letters, vol. 2, No. 1, 2002, pp. 49-53.

Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.

Bonard, et al., "Monodisperse Multiwall Carbon Nanotubes Obtained with Ferritin as Catalyst," Nano Letters, vol. 2, No. 6, 2002, pp. 665-667.

Brock, et al., "Carbon Nanotube Memories and Fabrics in a Radiation Hard Semiconductor Foundry," 2005 IEEE Conference, 9 pgs.

Brown, K. M., "System in package "The Rebirth of SIP"," 2004 IEEE Custom Integrated Circuits, May 2004, 6 pgs.

Cassell, et al., "Large Scale CVD Synthesis of Single-Walled Carbon Nanotubes," J. Phys. Chem. B, vol. 103, 1999, pp. 6484-6492.

Chen, et al., "Heterogeneous Single-Walled Carbon Nanotube Catalyst Discovery and Optimization," Chem. Mater., vol. 14, 2002, pp. 1891-1896.

Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.

Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 8297-8301.

Crowley, et al., "512 Mb PROM with 8 layers of antifuse/Diode cells," IEEE International Solid-State Circuits Conference, vol. XLVI, Feb. 2003, pp. 284-285.

Cui, et al., "Carbon Nanotube Memory Devices of High Charge," Applied Phys. Ltrs., vol. 81, No. 17, Oct. 2002, pp. 3260-3262.

Dai, et al., "Controlled Chemical Routes to Nanotube Architectures, Physics, and Devices," J. Phys. Chem. B, vol. 103, 1999, pp. 11246-11255.

Delzeit, et al., "Multilayered Metal Catalysts for Controlling the Density of Single-Walled Carbon Nanotube Growth," Chem. Phys. Ltrs., vol. 348, 2001, pp. 368-374.

Desai, et al., "Freestanding Carbon Nanotube Specimen Fabrication," Proceeding 2005 5th IEEE Conference on Nanotechnology, Nagoya, Japan, Jul. 2005, 4 pgs.

Engel, et al., "Thin Film Nanotube Transistors Based on Self-Assembled, Aligned, Semiconducting Carbon Nanotube Arrays," ACS Nano, 2008, vol. 2, No. 12, pp. 2445-2452.

Franklin, et al., "An Enhanced CVD Approach to Extensive Nanotube Networks with Directionality," Adv. Mater., vol. 12, No. 12, 2000, pp. 890-894.

(56) References Cited

OTHER PUBLICATIONS

Fuhrer, et al., "High-Mobility Nanotube Transistor Memory," Nano Letters, vol. 2, No. 7, 2002, pp. 755-759.
Haddon, et al., "Purification and Separation of Carbon Nanotubes," MRS Bulletin, Apr. 2004, pp. 252-259 (www.mrs.org/publicatons/bulletins).
Hafner, et al., "Catalytic Growth of Single-Wall Carbon Nanotubes from Metal Particles," Chem. Phys. Ltrs., vol. 296, 1998, pp. 195-202.
Homma, et al., "Single-Walled Carbon Nanotube Growth on Silicon Substrates Using Nanoparticle Catalysts," Jpn, J. Appl. Phys., vol. 41, 2002, pp. L89-L91.
Huai, Y., "Spin-Transfet Torque MRAM (STT-MTAM): Challenges and Prospects," AAPS Bulletin, vol. 18, No. 6, Dec. 2008, pp. 33-40.
International Search Report, International Patent Application No. PCT/US05/18467 dated Oct. 1, 2007, 5 pgs.
International Search Report, International Patent Application No. PCT/US05/18539 dated Sep. 18, 2006, 4 pgs.
International Search Report, International Patent Application No. PCT/US05/45316 dated Sep. 6, 2005, 2 pgs.
Jeong, et al., "A Purification Method of Single-Wall Carbon Nanotubes Using H2S and 02 Mixture Gas," Chem. Phys. Ltrs., vol. 344, Aug. 2001, pp. 18-22.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Joselevich, et al., "Vectorial Growth of Metallic and Semiconducting Single-Wall Carbon Nanotubes," Nano Letters, vol. 0, No. 0, A-E, 2002.
Kahn, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.
Nerushev, et al., "Carbon Nanotube Films Obtained by Thermal Chemical Vapour Deposition," J. Mater. Chem., vol. 11, 2001, pp. 1122-1132.
Niu, et al., "High Power Electrochemical Capacitors Based on Carbon Nanotube Electrodes," Appl. Phys. Ltrs., vol. 70, No. 11, Mar. 1997, pp. 1480-1482.
Novak, et al., "Nerve Agent Using Networks of Single-Walled Carbon Nanotubes," Appl. Phys. Ltr, vol. 83, No. 19, Nov. 2003, pp. 4026-4028.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem. B, vol. 105, 2001, pp. 9699-9710.
Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Servalli, G., "A 45nm Generation Phase Change Memory Technology," IEDM 2009 Technical Digest, pp. 5.7.1-5.7.4.
Shelimov, et al., "Purification of Single-Wall Carbon Nanotubes by Electronically Assisted Filtration," Chem. Phys. Ltrs., vol. 282, 1998, pp. 429-434.
Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.
Snow, et al., "Random Networks of Carbon Nanotubes as an Electronic Material," App. Phys. Ltrs., vol. 82, No. 13, Mar. 2003, pp. 2145-2147.
Sotiropoulou, et al., "Carbon Nanotube Array-Based Biosensor," Anal Bioanal Chem, vol. 375, 2003, pp. 103-105.
Star, et al., "Nanoelectronic Carbon Dioxide Sensors," Adv. Mater., vol. 16, No. 22, 2004, pp. 2049-2052.
Star, et al., "Nanotube Optoelectronic Memory Devices," Nano Letters, vol. 4, No. 9, 2004, pp. 1587-1591.
Valentini, et al., "Sensors for sub-ppm NO2 Gas Detection Based on Carbon Nanotube Thin Films," Appl. Phys. Ltrs., vol. 82, No. 6, Feb. 2003, pp. 961-963.
Ward, et al., "A Non-Volatile Nanoelectromechanical Memory Element Utilizing a Fabric of Carbon Nanotubes," IEEE 2004, pp. 34-38.
Zhang, et al., "Metal Coating on Suspended Carbon Nanotubes and its Implications to Metal-tube Interaction," Chem. Phys. Ltrs., vol. 331, 2000, pp. 35-41.
Zhang, et al., "Select Pathways to Carbon Nanotube Film Growth," Adv. Mater., vol. 13, No. 23, Dec. 2001, pp. 1767-1770.
Zhang, et al., "Formation of Metal Nanowires on Suspended Single-Walled Carbon Nanotubes," Appl. Phys. Ltrs., vol. 77, No. 19, Nov. 2000, pp. 3015-3017.
Zhao, et al., "Frequency-Dependent Electrical Transport in Carbon Nanotubes," Phys. Review B, vol. 64, 2001, pp. 201402-1-201402-4.
Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

\* cited by examiner 700
710

701
730
710

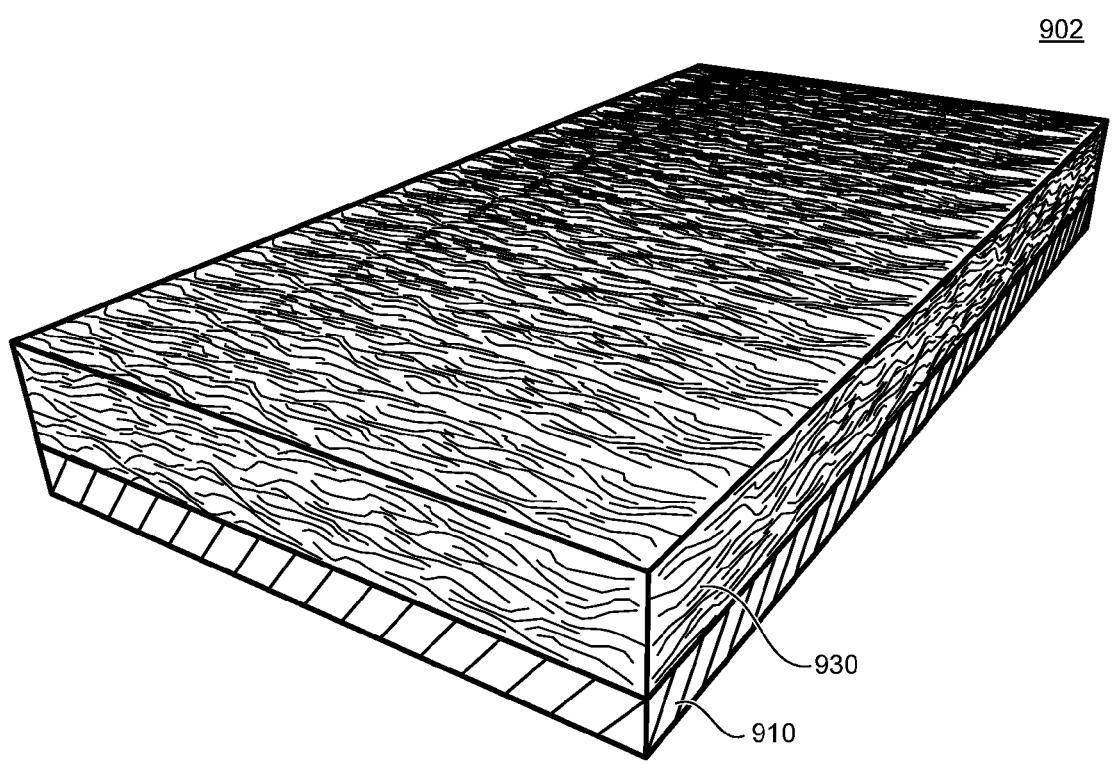
FIG.
9B

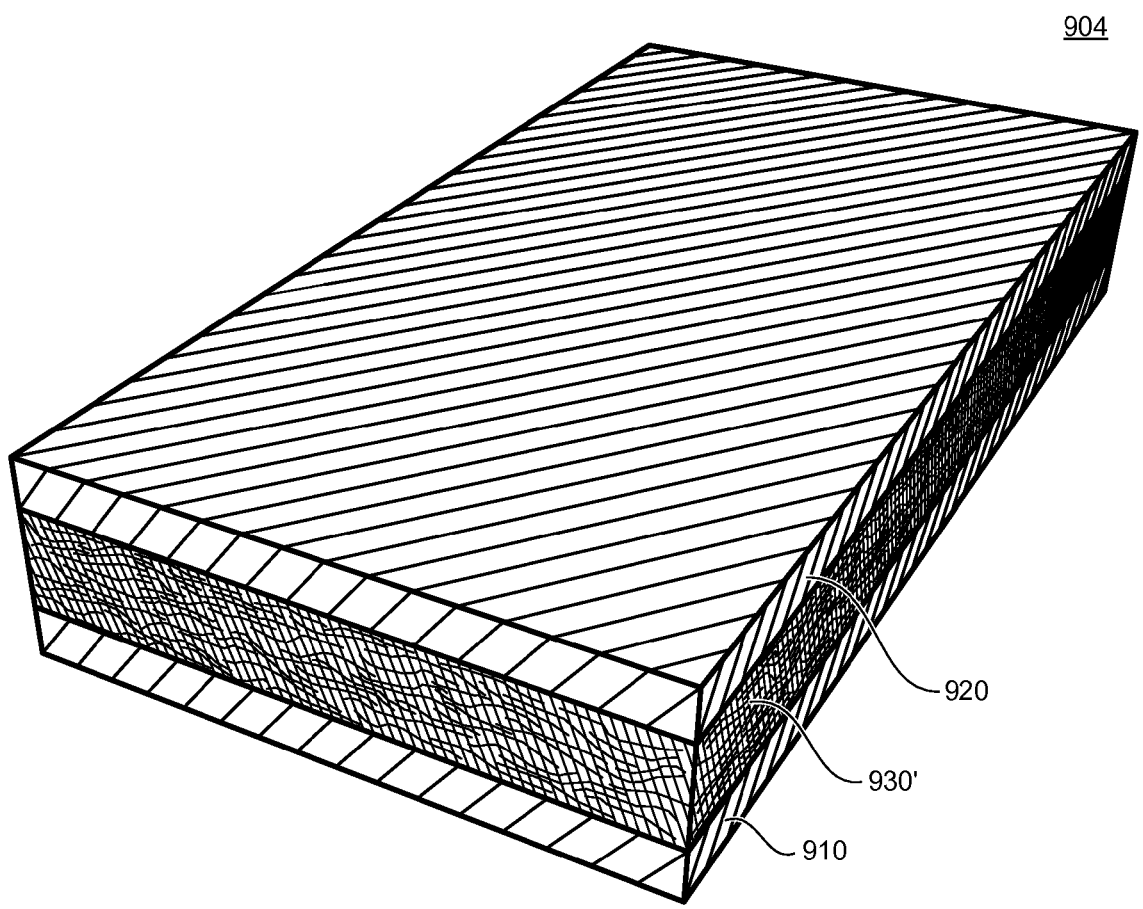
FIG.
9D

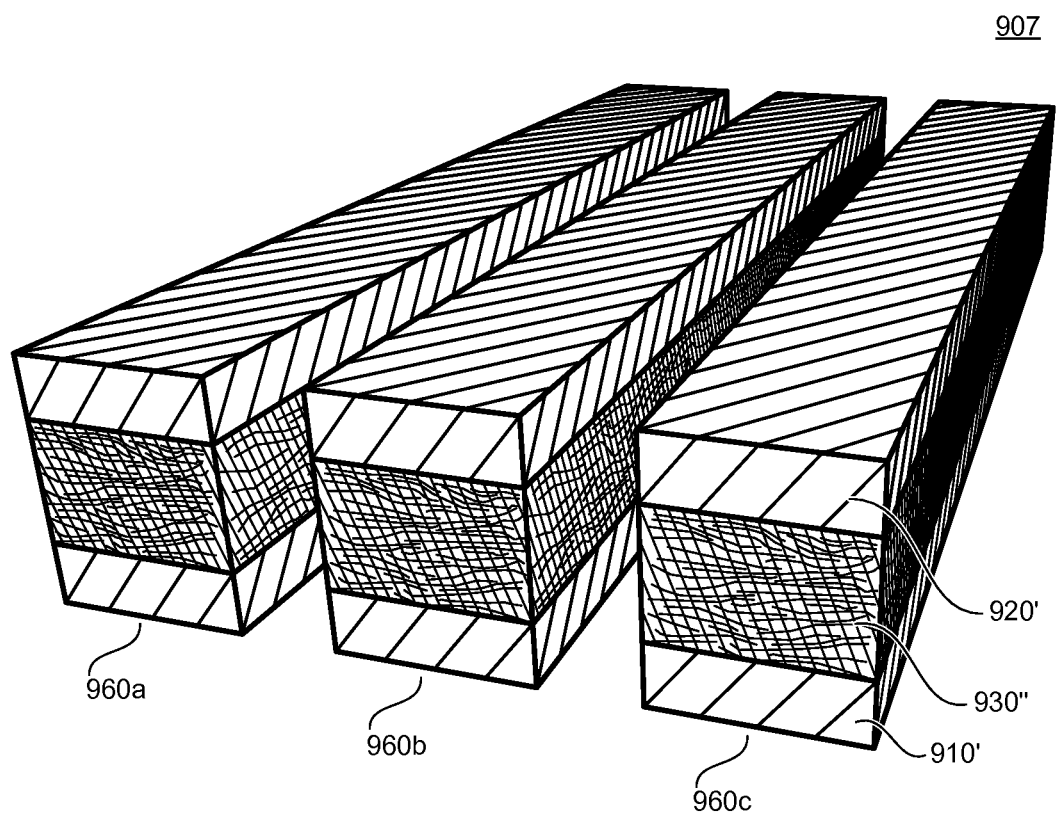
FIG.
9G

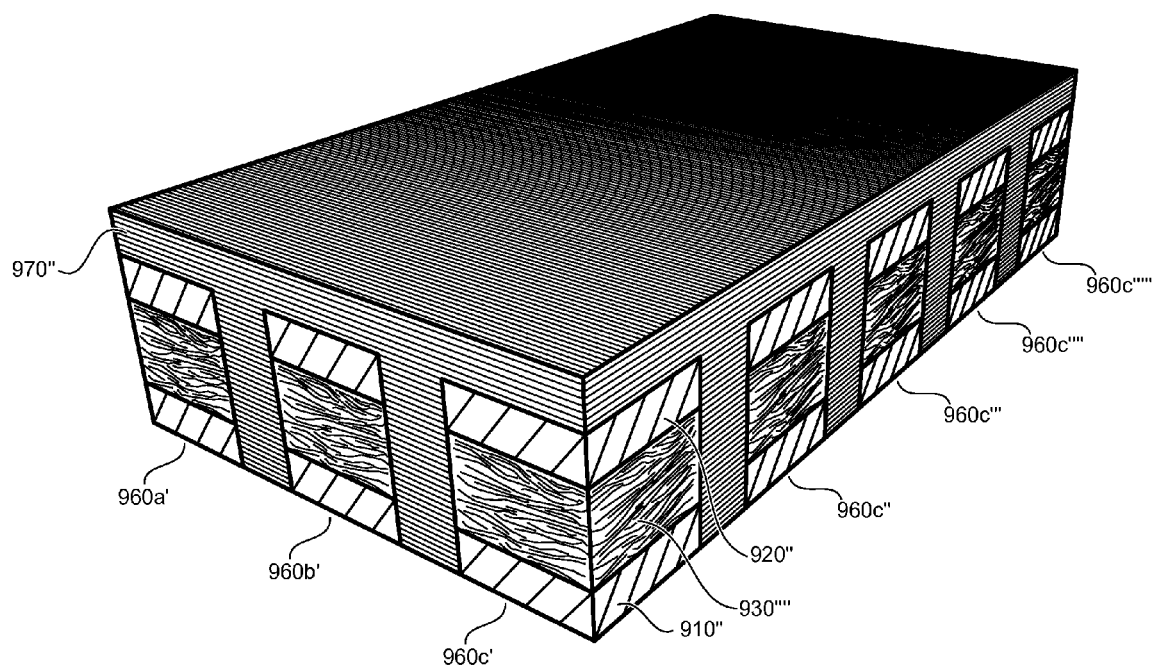
FIG.
9M

METHODS FOR PASSIVATING A CARBONIC NANOLAYER

This application is a continuation of U.S. patent application Ser. No. 14/020,095 filed Sep. 6, 2013 and entitled "Methods for Passivating a Carbonic Layer," which claims benefit of and is a divisional patent application of U.S. patent application Ser. No. 12/910,714 filed Oct. 22, 2010 and entitled "Methods for Passivating a Carbonic Nanolayer," which claims the benefit of U.S. Provisional Patent Application No. 61/254,588 filed Oct. 23, 2009 and entitled "Methods for Passivating a Nanotube Fabric Layer by Controlling the Density of the Nanotube Fabric Layer," the entire contents of each of which are incorporated herein by reference.

TECHNICAL FIELD

The present disclosure relates to nanotube based switching elements, and more particularly to methods of forming a passivated layer within the nanotube fabric layer of said switching elements.

CROSS-REFERENCE TO RELATED APPLICATIONS

This application is related to the following U.S. patents, which are assigned to the assignee of the present application, and are hereby incorporated by reference in their entirety:
Methods of Nanotube Films and Articles (U.S. Pat. No. 6,835,591), filed Apr. 23, 2002;
Methods of Using Pre-Formed Nanotubes to Make Carbon Nanotube Films, Layers, Fabrics, Ribbons, Elements, and Articles (U.S. Pat. No. 7,335,395), filed Jan. 13, 2003;
Spin-Coatable Liquid for Formation of High Purity Nanotube Films (U.S. Pat. No. 7,375,369), filed Jun. 3, 2004.

This application is related to the following patent applications, which are assigned to the assignee of the application, and are hereby incorporated by reference in their entirety:
Methods of Making Carbon Nanotube Films, Layers, Fabrics, Ribbons, Elements, and Articles (U.S. patent application Ser. No. 10/341,005), filed Jan. 13, 2003;
High Purity Nanotube Fabrics and Films (U.S. patent application Ser. No. 10/860,332), filed Jun. 3, 2004;
Two terminal Nanotube Devices and Systems and Methods of Making Same (U.S. patent application Ser. No. 11/280,786), filed Nov. 15, 2005;
Nanotube Articles with Adjustable Electrical Conductivity and Methods of Making the Same (U.S. patent application Ser. No. 11/398,126), filed Apr. 5, 2006;
Nonvolatile Nanotube Diodes and Nonvolatile Nanotube Blocks and Systems Using Same and Methods of Making Same (U.S. patent application Ser. No. 11/835,651), filed Aug. 8, 2007;
Nonvolatile Resistive Memories Having Scalable Two terminal Nanotube Switches (U.S. patent application Ser. No. 11/835,612), filed Aug. 8, 2007;
Nonvolatile Nanotube Diodes and Nonvolatile Nanotube Blocks and Systems Using Same and Methods of Making Same (U.S. patent application Ser. No. 11/835,856), filed Aug. 8, 2008;
Memory Elements and Cross Point Switches and Arrays of Same Using Nonvolatile Nanotube Blocks (U.S. patent application Ser. No. 12/511,779), filed Jul. 29, 2009;
Nonvolatile Nanotube Diodes and Nonvolatile Nanotube Blocks and Systems Using Same and Methods of Making Same (U.S. patent application Ser. No. 12/273,807), filed Nov. 19, 2008;
Improved Switching Materials Comprising Mixed Nanoscopic Particles and Carbon Nanotubes and Methods of Making and Using Same (U.S. patent application Ser. No. 12/274,033), filed Nov. 19, 2008.

BACKGROUND OF THE INVENTION

Any discussion of the related art throughout this specification should in no way be considered as an admission that such art is widely known or forms part of the common general knowledge in the field.

Nanotube based switching devices offer a plurality of uses within commercial electronics. Such nanotube based switching elements can be used as nonvolatile memory devices, combined to form logic devices, and used to form analog circuit elements such as, but not limited to, nanotube based field effect transistors and programmable power supplies. In particular, two terminal nanotube based switching devices are becoming increasingly desirable within electronic systems—such as, but not limited to, memory arrays, microprocessors, and FPGAs—and arrays of such devices are continually increasing in complexity and density, creating a need for smaller and smaller individual devices.

SUMMARY OF THE DISCLOSURE

The current invention relates to the passivation of nanotube fabric layers within two terminal nanotube switching devices.

In particular, the present disclosure provides a nanotube switching device. This nanotube switching device comprises a first conductive element, a second conductive element, and a nanotube fabric layer which includes a plurality of individual nanotube elements. The nanotube fabric layer includes a first side and a second side, wherein the first side of the nanotube fabric layer is electrical coupled to the first conductive element and the second side of said nanotube fabric layer is electrically coupled to the second conductive element. The density of the nanotube fabric layer is selected such as to limit the encroachment of at least one of the first conductive element and the second conductive element into the nanotube fabric layer.

The present disclosure also provides another nanotube switching device. This nanotube switching device comprises a first conductive element, a second conductive element, a first nanotube fabric layer (which includes a first plurality of individual nanotube elements), and a second nanotube fabric layer (which includes a second plurality of individual nanotube elements). The first nanotube fabric layer includes a first side a second side, and the second nanotube layer also includes a first side and a second side. Within this nanotube switching device, the first side of the first nanotube fabric layer is electrically coupled to the first side of said second nanotube fabric layer; the second side of the first nanotube fabric layer is electrically coupled to the first conductive element; and the second side of the second nanotube fabric layer is electrically coupled to the second conductive element. Further, the density of the second nanotube fabric layer is selected as to limit the encroachment of the second conductive element into the second nanotube fabric layer and the density of the first nanotube fabric layer is selected as to optimize the switching operation of the first nanotube fabric layer.

The present disclosure also provides a method for forming a nanotube switching device. This method comprises first forming a nanotube fabric layer over a first material layer, the nanotube fabric layer comprising a plurality of individual nanotube elements. The method further comprises flowing a sacrificial material over the nanotube fabric layer such that the sacrificial material penetrates the nanotube fabric layer and forms a barrier layer within the nanotube fabric layer. The method further comprises depositing a second material layer adjacent to the nanotube fabric layer. The method further comprises volatizing and removing at least a portion of the barrier layer.

The present disclosure also provides another method for forming a nanotube switching device. This method comprises forming a nanotube fabric layer over a first material layer, the nanotube fabric layer comprising a plurality of individual nanotube elements. The method further comprises flowing a filler material over the nanotube fabric layer such that the filler material penetrates the nanotube fabric layer and forms a barrier layer within the nanotube fabric layer. The method further comprises depositing a second material layer adjacent to the nanotube fabric layer.

The present disclosure also provides another method for forming a nanotube switching device. This method comprises combining a first volume of individual nanotube elements and a second volume of nanoscopic particles in a liquid medium to form an application solution. The method further comprises depositing the application solution over a first material layer as to form a composite switching layer, this composite layer comprising a mixture of individual nanotube elements and nanoscopic particles. The method further comprises depositing a second material layer adjacent to the composite switching layer.

The present disclosure also provides another method for forming a nanotube switching device. This method comprises combining a first volume of individual nanotube elements and a second volume of nanoscopic particles in a liquid medium to form an application solution. The method further comprises depositing the application solution over a first material layer as to form a composite switching layer, this composite layer comprising a mixture of individual nanotube elements and nanoscopic particles. The method further comprises flowing a filler material over the composite switching layer such that the filler material penetrates the composite switching layer and forms a barrier layer within the composite layer. The method further comprises depositing a second material layer adjacent to said composite switching layer.

Accordingly it is the object of the present disclosure to provide a plurality of methods for passivating a nanotube fabric layer.

It is also an object of the present disclosure that these passivation methods do not impede or otherwise adversely affect the switching characteristics of a nanotube fabric layer in which they are employed.

It is further an object of the present disclosure that these passivation methods be compatible within the fabrication of a two terminal nanotube switching device as taught by Bertin in Ser. No. 11/280,786.

It is also an object of the present disclosure that these passivation methods allow for the fabrication of two terminal nanotube switching devices with nanotube fabric layers of thicknesses on the order of 20 nm.

Other features and advantages of the present disclosure will become apparent from the following description of the disclosure which is provided below in relation to the accompanying drawings.

BRIEF DESCRIPTION OF THE DRAWINGS

FIGS. 9A-9M are a series of process diagrams which illustrate a method of passivating a nanotube fabric layer through the use of a sacrificial filler material wherein the sacrificial material is volatized during the formation of the individual two terminal nanotube switching elements within an array;

DETAILED DESCRIPTION

U.S. patent application Ser. No. 11/280,786 to Bertin et. al, incorporated herein by reference, teaches the fabrication of such two terminal nanotube switching devices. As taught by Bertin, a two terminal switching device includes a first and second conductive terminals and a nanotube article. The nanotube article overlaps a portion of each of the first and second conductive terminals. In at least some embodiments described by Bertin, the nanotube article is a nanotube fabric layer disposed over the first conductive terminal. In such embodiments the second conductive terminal is disposed over the nanotube fabric layer, forming a three layer device with the nanotube fabric layer substantially between the first and second conductive elements.

Bertin further describes methods for adjusting the resistivity of the nanotube fabric layer between a plurality of nonvolatile resistive states. In at least one embodiment, electrical stimuli is applied to at least one of the first and second conductive elements such as to pass an electric current through said nanotube fabric layer. By carefully controlling these electrical stimuli within a certain set of predetermined parameters (as described by Bertin in Ser. No. 11/280,786) the resistivity of the nanotube fabric layer can be repeatedly switched between a relatively high resistive state and relatively low resistive state. In certain embodiments, these high and low resistive states can be used to store a digital bit of data (that is, a logic "1" or a logic "0").

Figure 1:
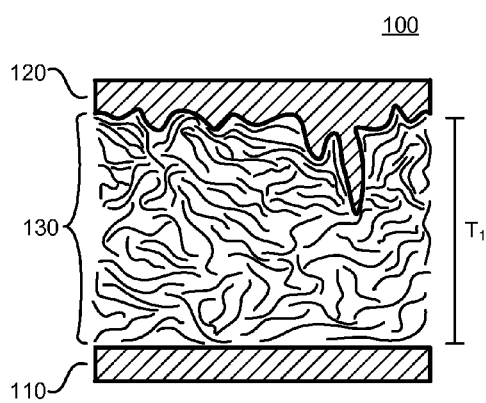
FIG. 1 is an illustration depicting a first two terminal nanotube switching device comprising a nanotube fabric layer of thickness $T_1$.

FIG. 1 illustrates a first two terminal nanotube switching device 100. In certain embodiments, a nanotube fabric layer 130 (of thickness $T_1$) is deposited over a first conductive element 110 in a first operation. In a second operation, a second conductive element 120 is deposited over the nanotube fabric layer 130. As depicted in FIG. 1, as the second conductive element 120 is applied, the second conductive element 120 may seep partially into the porous nanotube fabric layer 130. Typically such penetration is not problematic or detrimental to the operation of two terminal nanotube switching device 100 as the thickness ($T_1$) of the nanotube fabric layer 130 is significantly larger than the depth of the penetration. That is, while second conductive element 120 seeps partially into porous nanotube fabric layer 130, the nanotube fabric layer 130 is thick enough to prevent an electrical short between the first conductive element 110 and the second conductive element 120.

Figure 2:
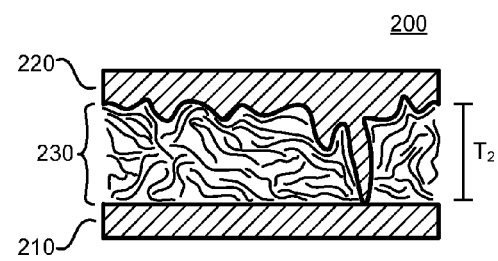
FIG. 2 is an illustration depicting a second two terminal nanotube switching device comprising a nanotube fabric layer of thickness $T_2$.

FIG. 2 illustrates a second two terminal nanotube switching device. Two terminal nanotube switching device 200 (as depicted in FIG. 2) is intended to illustrate a switching device fabricated on a significantly smaller scale as compared with the two terminal nanotube switching device 100 depicted in FIG. 1. Nanotube fabric layer 230 (of thickness $T_2$) is deposited over a first conductive element 210 in a first operation. In a second operation, a second conductive element 220 is deposited over nanotube fabric layer 230. As with the two terminal nanotube switching device 100 depicted in FIG. 1, the second conductive element 220 may seep partially into the porous nanotube fabric layer 230. However, in certain embodiments, as nanotube fabric layer 230 is relatively thin, second conductive element 220 can substantially penetrates all the way through porous nanotube fabric layer 230, effectively forming an electrical short circuit between first conductive element 210 and second conductive element 220.

In one non-limiting example, $T_1$ (the thickness of the nanotube fabric layer 130) is on the order of 100 nm, while $T_2$ (the thickness of the nanotube fabric layer 230) is on the order of 20 nm. In another non-limiting example, $T_2$ would be on the order of 5 nm. It should be noted that while these exemplary thickness values are intended to illustrate a specific fabrication issue as two terminal nanotube switching devices are realized on increasingly smaller scales, this fabrication issue is not limited to these dimensions. Further, a plurality of factors may contribute to the depth of which a conductive element will penetrate into a nanotube fabric layer over which it is deposited. Such factors include, but are not limited to, the density of the nanotube fabric layer, the method used to deposit the overlying conductive layer, and the material used to form the overlying conductive layer.

As described in the preceding discussion, FIG. 2 illustrates a potential limitation as the physical dimensions of two terminal nanotube switches are reduced. Nanotube fabrics can be porous and can be susceptible to penetration by a material deposited over them. Further, the performance of nanotube fabric layers within such switching devices can be degraded by certain materials, gases, or contaminants. For example, oxygen and water can react with CNTs at high temperatures. Carbon nanotubes can also be functionalized with other contaminating materials—such as, but not limited to, fluorine and chlorine—which may also deteriorate the operational parameters of a nanotube fabric layer by altering the electrical properties of the individual carbon nanotubes elements within the fabric and carbon nanotube. Furthermore, without wishing to be bound by theory, within a two terminal nanotube switching device, the nanometer-level motion of the individual nanotube elements may desirably remain unhindered by the surrounding device structure.

As such, certain embodiments of the present invention provides a method of two terminal nanotube switch fabrication which provides a physical barrier (a passivation layer) adjacent to or within the nanotube fabric layer such that adjacent material layers as well as other contaminants are prevented from penetrating the nanotube fabric layer. Certain embodiments of the present invention further advantageously provide this method without interfering with or otherwise adversely affecting the switching operation of the nanotube fabric layer.

The present disclosure involves the passivation of nanotube fabric layers within the fabrication of two terminal nanotube switching devices. As will be shown in the following discussion of the present disclosure, nanotube fabric layers can be passivated—that is formed or prepared in such a way as to prevent or otherwise limit the encroachment of an adjacent material layer—in a plurality of ways.

In some aspects of the present disclosure, a nanotube fabric layer can be passivated by increasing the density of the nanotube fabric layer by adjusting one or more characteristics of the individual nanotube elements contained in the nanotube fabric layer (e.g., length, orientation, etc.). This increased density limits the porosity of the nanotube fabric layer, thereby limiting the depth to which an adjacent material layer can penetrate.

In some aspects of the present invention, a sacrificial material is implanted within a porous nanotube fabric layer during the fabrication process. This sacrificial material is used to fill in the voids and gaps within the porous nanotube fabric layer while one or more other material layers are applied adjacent to the nanotube fabric layer. Once the other material layers are in place, the sacrificial material is removed, allowing the nanotube fabric layer to function.

In other aspects of the present disclosure, a non-sacrificial filler material is used to passivate a nanotube fabric layer. Within these aspects of the present disclosure, a filler material is selected and deposited within a nanotube fabric layer in such a way as to not adversely affect the switching function of the nanotube fabric layer. In this way, a barrier layer is formed within the porous nanotube fabric layer which prevents an adjacent material layer from fully penetrating through the nanotube fabric layer.

In other aspects of the present disclosure, a nanotube fabric layer is formed comprising a first plurality of individual nanotube elements and a second plurality of nanoscopic particles. The second plurality of nanoscopic particles serves to limit the porosity of the nanotube fabric layer, thereby limiting the encroachment of adjacent material layers into the nanotube fabric layer. The nanoscopic particles are selected and combined with the individual nanotube elements in such a way as to not adversely affect the switching operation of the nanotube fabric layer.

Each of these aspects will be described in the following sections in accordance with the accompanying figures.

Within the methods of the present disclosure, nanotube fabric layers can be formed over substrate elements. The methods include, but are not limited to, spin coating (wherein a solution of nanotubes is deposited on a substrate which is then spun to evenly distribute said solution across the surface of said substrate), spray coating (wherein a plurality of nanotube are suspended within an aerosol solution which is then disbursed over a substrate), and in situ growth of nanotube fabric (wherein a thin catalyst layer is first deposited over a substrate and then used to form nanotubes). (See, e.g., U.S. Pat. No. 7,335,395 to Ward et al., which is incorporated herein by reference in its entirety.) U.S. Pat. No. 7,375,369 to Sen et al., and U.S. Patent Publication No. 2006/0204427, both of which are incorporated herein by reference in its entirety, teach nanotube solutions which is well suited for forming a nanotube fabric layer over a substrate element.

It should also be noted that while the figures within the present disclosure (as well as the accompanying description of those figures) depict substantially vertically oriented two terminal nanotube switching devices—that is, a nanotube fabric layer positioned between a first conductive element below and a second conductive element above—the methods of the present disclosure are not limited in this regard. Indeed, as is described in the incorporated references (most notably U.S. patent application Ser. No. 11/835,651 to Bertin et. al., incorporated herein by reference in its entirety) two terminal nanotube switching devices can be formed within a plurality of orientations, including, but not limited to, vertical, horizontal, two dimensional (wherein a nanotube fabric layer is in contact with two or more electrode elements substantially in the same plane), and disposed over one or more flexible electrode elements. It will be clear to those skilled in the art that the methods of the present disclosure (as described below with respect to substantially vertical two terminal switching devices for the sake of clarity) are applicable to two terminal nanotube switching devices constructed in any of these orientations.

It should also be noted that while the figures within the present disclosure (as well as the accompanying description of those figures) describe the passivation methods of the present disclosure within the scope of the fabrication of two terminal nanotube switching devices, the methods of the present disclosure are not limited in this regard. Indeed, the passivation methods of the present invention are directly applicable to the fabrication of a plurality of nanotube fabric based devices including, but not limited to, nanotube fabric based sensors, nanotube fabric based field effect transistors, and nanotube fabric based logic devices.

Passivation Through the Use of Dense Nanotube Fabric Layers

Figure 4:
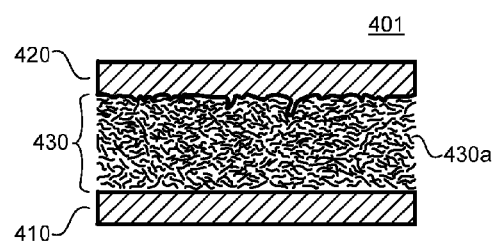
FIG. 4 is an illustration depicting a two terminal nanotube switching device wherein the porosity of nanotube fabric layer has been selected by limiting the length of the individual nanotube elements comprising the nanotube fabric layer.
Figure 5:
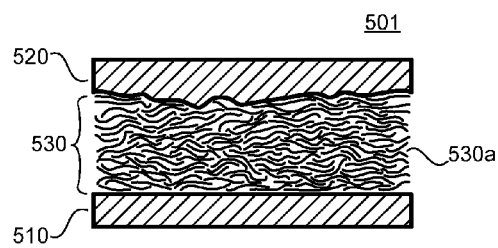
FIG. 5 is an illustration depicting a two terminal nanotube switching device wherein the porosity of nanotube fabric layer has been selected through the use of a specific application method.
Figure 6:
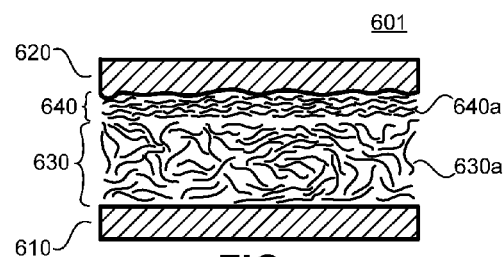
FIG. 6 is an illustration depicting a two terminal nanotube switching device comprising multiple nanotube fabric layers.

In one aspect of the present disclosure, a nanotube fabric layer is passivated by increasing the density of the nanotube fabric layer, such as by adjusting one or more characteristics of the individual nanotube elements contained in the nanotube fabric layer (e.g., length, orientation, etc.). This increased density limits the porosity of the nanotube fabric layer, thereby limiting the depth to which an adjacent material layer can penetrate. Within this aspect of the present disclosure, the density of a nanotube fabric layer can be increased by limiting the length of the individual nanotube elements comprising the nanotube fabric layer (as depicted in FIG. 4), through the use of a specific application method—such as, but not limited to, spin coating—which deposits the individual nanotube elements in a dense fabric (as depicted in FIG. 5), or through the use of a top layer of individual nanotubes specially deposited to provide a densely packed barrier layer (as depicted in FIG. 6). Each of these methods is described in detail in the following discussion of FIGS. 3-6.

Figure 3:
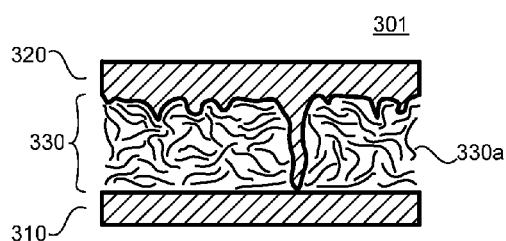
FIG. 3 is an illustration depicting a two terminal nanotube switching device comprising a low density nanotube fabric layer with a relatively high porosity.

FIG. 3 illustrates a first two terminal nanotube switching device 301 comprising a porous nanotube fabric layer 330 deposited over a first conductive layer 310. Porous nanotube fabric layer 330 is comprised of a plurality of individual nanotube elements 330a, all of which are substantially the same length. A second conductive layer 320 is deposited over porous nanotube fabric layer 330. As with the two terminal nanotube switching device depicted in FIG. 2 (200 in FIG. 2), the porosity of the nanotube fabric layer 330 is such that second conductive layer 320 is permitted to seep through the nanotube fabric layer 330 and make electrical contact with first conductive layer 310, essentially establishing a short circuit through nanotube fabric layer 330.

FIG. 4 illustrates another two terminal nanotube switching device 401 wherein the porosity of nanotube fabric layer 430 has been selected by limiting the length of the plurality of individual nanotube elements 430a within nanotube fabric layer 430. The shorter individual elements 430a form a significantly denser fabric layer 430 (as compared with nanotube fabric layer 330 in FIG. 3) as they are deposited over first conductive layer 410. In this way, the porosity of nanotube fabric layer 430 has been reduced such as to prevent second conductive layer 420 from seeping through nanotube fabric layer 430 and coming into physical or direct electrical contact with first conductive layer 410.

Within a non-limiting example, for instance, the individual nanotube elements 330a of nanotube fabric layer 330 might be on the order of 1 µm, and the individual nanotube elements 430a of nanotube fabric layer 430 might be on the order of 0.4 µm.

FIG. 5 illustrates another two terminal nanotube switching device 501 wherein the porosity of nanotube fabric layer 530 has been selected through the use of a specific application method—such as, but not limited to, spin coating or dip coating—to form nanotube fabric layer 530 over first conductive layer 510.

Within a spin coating operation, individual nanotube elements 530a may be suspended in a solvent in a soluble or insoluble form and spin-coated over a surface to generate a nanotube film. In such an arrangement the nanotube fabric layer created may be one or more nanotubes thick, depending on the spin profile and other process parameters. Appropriate solvents include, but are not limited to: dimethylformamide, n-methylpyrollidinone, n-methyl formamide, ethyl lactate, alcohols, water with appropriate surfactants such as sodium dodecylsulfate or TRITON X-100, water alone, anisol or other solvents. The nanotube concentration and deposition parameters such as surface functionalization, spin-coating speed, temperature, pH and time can be adjusted for controlled deposition of monolayers or multilayers of nanotubes as required.

The nanotube film could also be deposited by dipping a wafer or a substrate (such as first conductive layer 510) in a solution of soluble or suspended nanotubes (a dip coating process).

Both spin coating and dip coating allow for the formation of a nanotube fabric layer 530 which is significantly denser—and, in some embodiments, substantially uniform in density—than could be realized with other deposition methods.

For example, spray coating—wherein a nanotube fabric is formed by spraying a plurality of individual nanotube elements in the form of an aerosol onto a surface—typically yields a nanotube fabric layer with a non-uniform density and comprising a plurality of voids which tend to allow the penetration of adjacent material layers.

In this way, a highly dense nanotube fabric layer 530 deposited through a spin coating or dip coating process will limit the penetration of an adjacent material layer, such as second conductive layer 520.

While the highly dense nanotube fabric layers depicted in FIG. 4 and FIG. 5 (430 and 530, respectively) provide an effective passivation method, in some applications such a nanotube fabric layer may prove inconvenient or impractical to produce. A highly dense nanotube fabric layer (such as 430 in FIG. 4 or 530 in FIG. 5) uses significantly more individual nanotube elements than a comparatively less dense fabric layer of similar geometry (such as 330 in FIG. 3, for example), resulting in significantly higher fabrication costs. Moreover, a densely packed nanotube fabric layer will tend to possess a very low resistance range as compared to a less dense fabric layer of similar geometry, significantly limiting, in some applications, the nanotube fabric layer's usefulness within a two terminal nanotube switch. In some applications, therefore, a single highly dense nanotube fabric layer may not provide a complete solution to the problem of adjacent material layer penetration. To this end, FIG. 6 illustrates a two terminal nanotube switching device comprising multiple nanotube fabric layers.

Referring now to FIG. 6, a first nanotube fabric layer 630, comprising a plurality of individual nanotube elements 630a, is deposited over a first conductive layer 610 in a first operation. In a second operation, a second nanotube fabric layer 640, comprising a plurality of individual nanotube elements 640a, is deposited over the first nanotube fabric layer 630. The second nanotube fabric layer is formed with a relatively high density (as described in the discussions of FIGS. 4 and 5 above), preventing second conductive layer 620 from penetrating the second nanotube fabric layer. In some embodiments of this aspect of the present disclosure, second nanotube fabric layer 640 includes a plurality of rafted nanotube elements. That is, wherein the second nanotube fabric layer 640 is deposited in such a manner that the individual nanotube elements 640a are bundled together along their sidewalls, providing a highly dense fabric layer.

Within this aspect of the present disclosure, the density of the first nanotube fabric layer can be selected according to the needs of the specific application wherein this aspect of the present disclosure is used. In this way a highly dense nanotube fabric layer is used to prevent the second conductive layer 620 from electrically shorting to the first conductive layer 610 while still preserving the benefits of using a comparatively less dense nanotube fabric layer within the two terminal nanotube switching device.

Passivation Through the Use of a Sacrificial Material

In another aspect of the present disclosure, a nanotube fabric layer is passivated by using a sacrificial filler material during the fabrication of a two terminal nanotube switching device. Within this aspect of the present disclosure, a sacrificial material is deposited over and allowed to penetrate a porous nanotube fabric layer prior to the deposition of an adjacent material layer. This sacrificial material effectively fills in the pores of the nanotube fabric layer, preventing the adjacent material layer from penetrating the nanotube fabric layer during the fabrication process. Once the adjacent material layer is formed, the sacrificial material is etched away, allowing the nanotube fabric layer to function within the two terminal nanotube switching device.

FIGS. 7A-7J illustrate a method of passivating a nanotube fabric layer through the use of a sacrificial filler material.

Figure 7A:
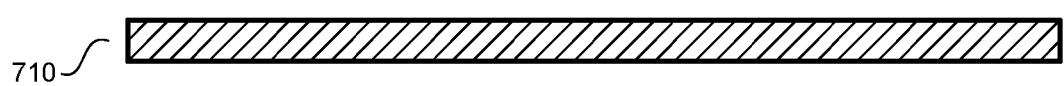
FIGS. 7A-7J are a series of process diagrams which illustrate a method of passivating a nanotube fabric layer through the use of a sacrificial filler material.
Figure 7B:
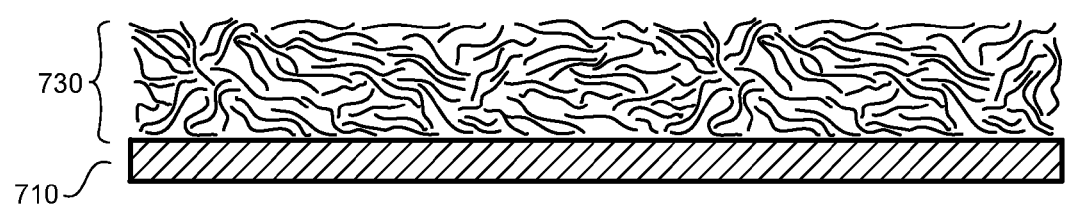
Figure 7C:
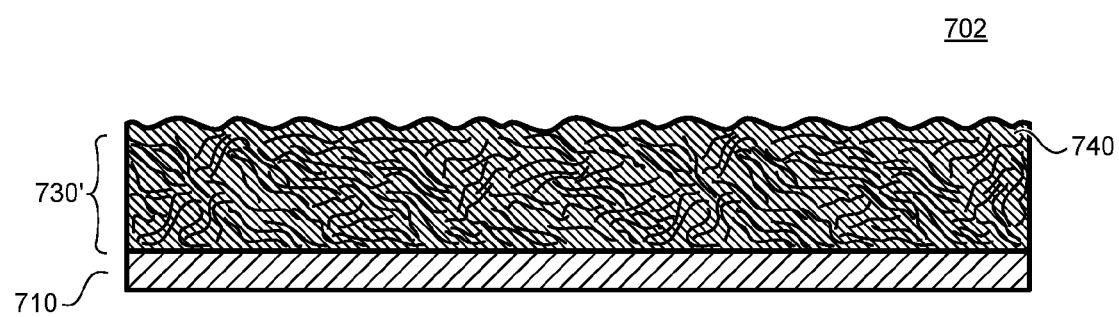
Figure 7D:
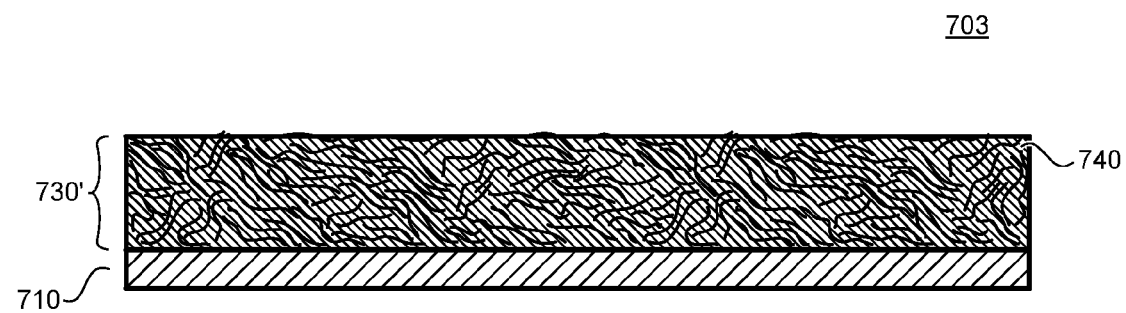

Referring now to FIG. 7A, in a first process step 700 a first conductive layer 710 is provided. Referring now to FIG. 7B, in a second process step 701 a porous nanotube fabric layer 730 is deposited over the first conductive layer 710. Referring now to FIG. 7C, in a third process step 702 a sacrificial material 740—such as, but not limited to, phospho silicate glass (PSG) oxide, spin on glass, a physical vapor deposition (PVD) of germanium, or a sacrificial polymer—is flowed over the porous nanotube fabric layer 730 such that it substantially permeates porous nanotube fabric layer 730 forming combined nanotube fabric/sacrificial material layer 730'. Referring now to FIG. 7D, in a fourth process step 703, excess sacrificial material 740 is etched (e.g., dry etching such as reactive ion etching) to remove any material overflowing the top of layer 730'.

It should be noted that while FIG. 7C (and subsequent figures) depicts sacrificial material 740 as essentially completely penetrating nanotube fabric layer 730, the methods of the present disclosure are not limited in this regard. Indeed, as will become evident in the following description of this aspect of the present disclosure, the depth to which the sacrificial material 740 penetrates the nanotube fabric layer 730 is not important so long as the sacrificial material 740 forms a barrier within the nanotube fabric layer which prevents an adjacent material layer from penetrating. Similarly, while FIG. 7C depicts sacrificial material 740 overflowing the nanotube fabric layer (necessitating process step 703 depicted in FIG. 7D), the methods of the present disclosure are not limited in this regard. Indeed, it will be obvious to those skilled in the art that in some applications a sacrificial material could be deposited in such a way that it does not overflow nanotube fabric layer 730, eliminating the need for process step 703.

Figure 7E:
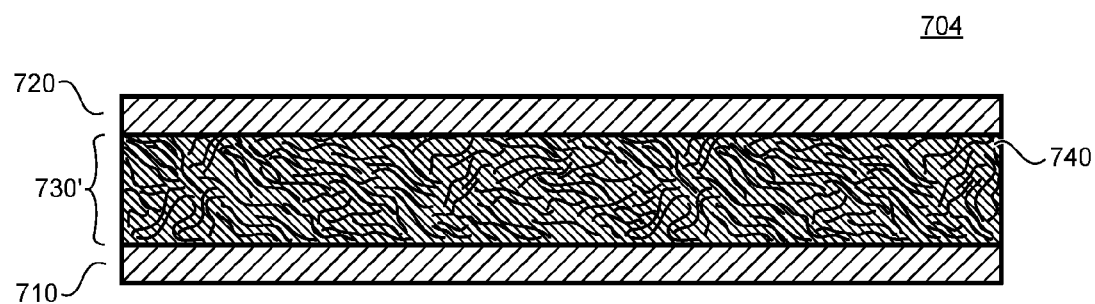

Referring now to FIG. 7E, in a fifth process step 704, a second conductive layer 720 is deposited over the combined nanotube fabric/sacrificial material layer 730'. As the sacrificial material 740 substantially fills in the pores of the original nanotube fabric layer 730, second conductive layer 720 does not seep into the combined nanotube fabric/sacrificial material layer 730'.

Figure 7F:
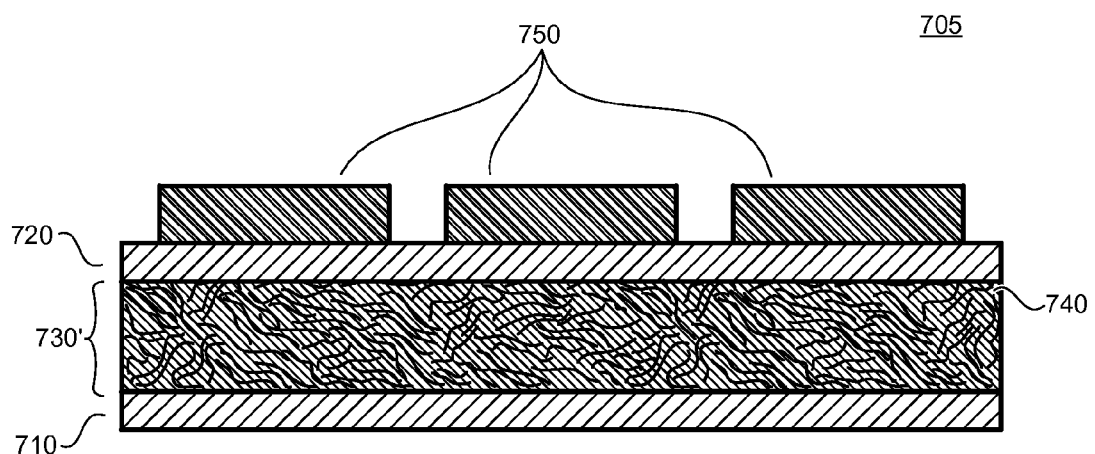
Figure 7G:
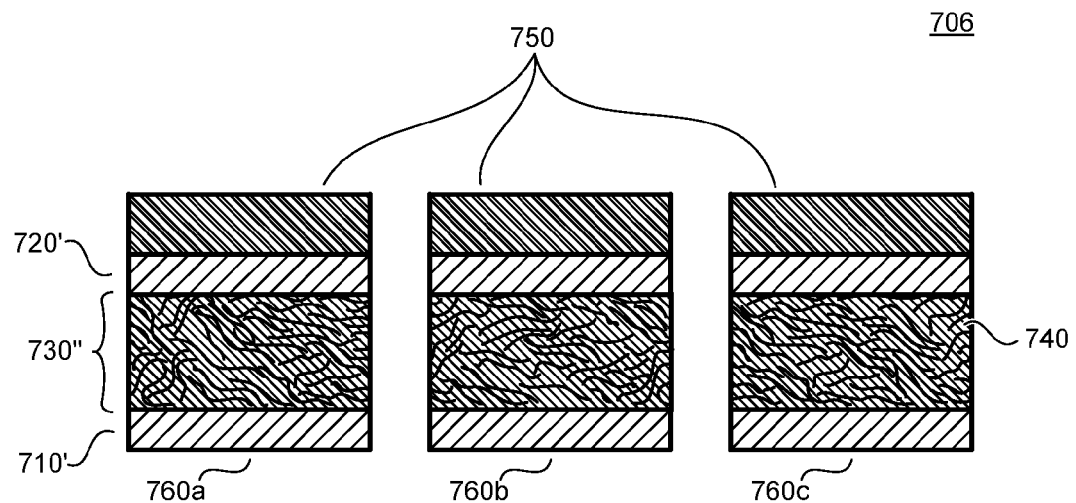

Referring now to FIG. 7F, in a sixth process step 705 a hard mask layer 750—such as, but not limited to, an amorphous carbon layer—is deposited in such a way as to define a plurality of individual two terminal switching devices. Referring now to FIG. 7G, in a seventh process step 706, an etch process is used to remove those portions of first conductive layer 710, combined nanotube fabric/sacrificial material layer 730', and second conductive layer 720 not covered by hard mask layer 750. In this way, three individual nanotube switching devices 760a, 760b, and 760c are realized, each comprising a first conductive layer 710', a patterned combined nanotube fabric/sacrificial material layer 730", and a second conductive layer 720'. It should be noted that in some embodiments, sacrificial material 740—in addition to passivating the nanotube fabric layer 730 during the fabrication process—may also provide structural integrity to the individual two terminal nanotube switching elements 760a, 760b, and 760c during the fabrication process.

Figure 7H:
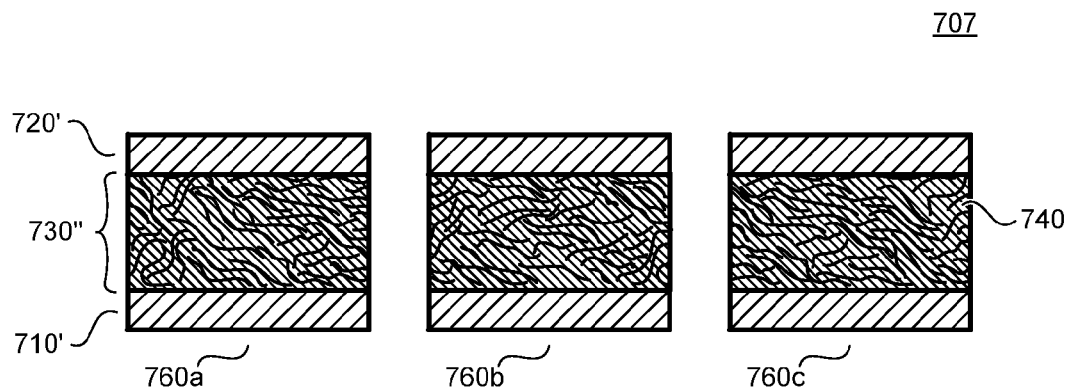

Referring now to FIG. 7H, in an eighth process step 707, the hard mask layer (750 in FIG. 7G) is removed.

Figure 7I:
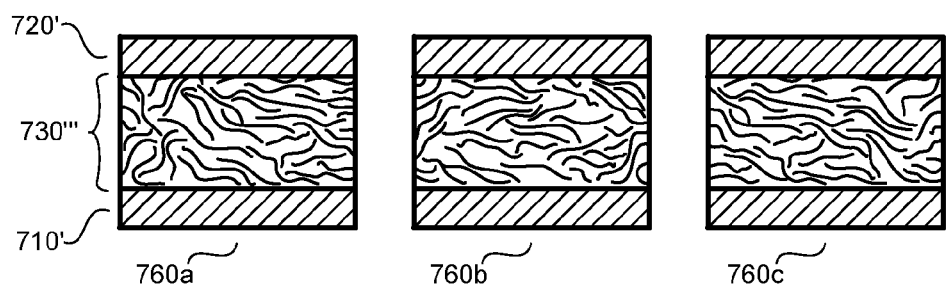
Figure 7J:
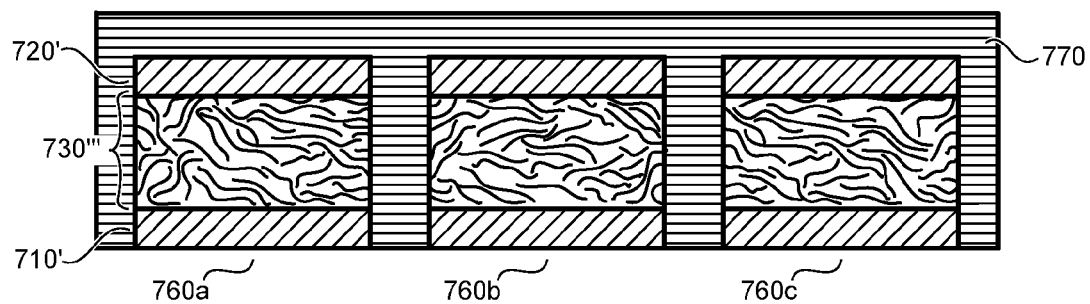

Referring now to FIG. 7I, in a ninth process step 708, a wet etch process—such as, but not limited to, a hydrofluoric etch—is used to volatize and remove sacrificial material 740 through the exposed sides of each combined nanotube fabric/ sacrificial material layer 730" in each of individual nanotube switching elements 760a, 760b, and 760c. In this way each of the individual nanotube switching devices (760a, 760b, and 760c) is left with a patterned passivated nanotube fabric layer 730'". Referring now to FIG. 7J, in a final process step 709, a dielectric material 770—such as, but not limited to, silicon nitride (SiN)—is deposited over the individual nanotube switch elements 760a, 760b, and 760c.

In this way, a sacrificial material is flowed over a nanotube fabric layer and is used to passivate—as well as, in some embodiments, provide structural support for—the nanotube fabric layer as it is etched into individual narrow blocks to form a plurality of two terminal nanotube switch elements.

FIGS. 8A-8K illustrate another method of passivating a nanotube fabric layer through the use of a sacrificial filler material wherein the sacrificial material is volatized and removed through a non-hermetic material layer.

Figure 8A:
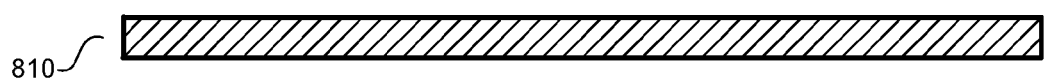
FIGS. 8A-8K are a series of process diagrams which illustrate a method of passivating a nanotube fabric layer through the use of a sacrificial filler material wherein the sacrificial material is volatized and removed through a non-hermetic material layer.
Figure 8B:
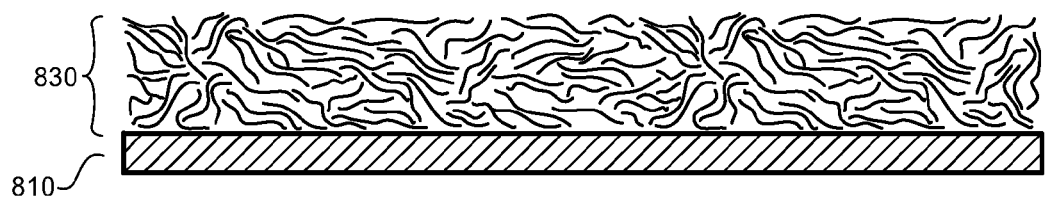
Figure 8C:
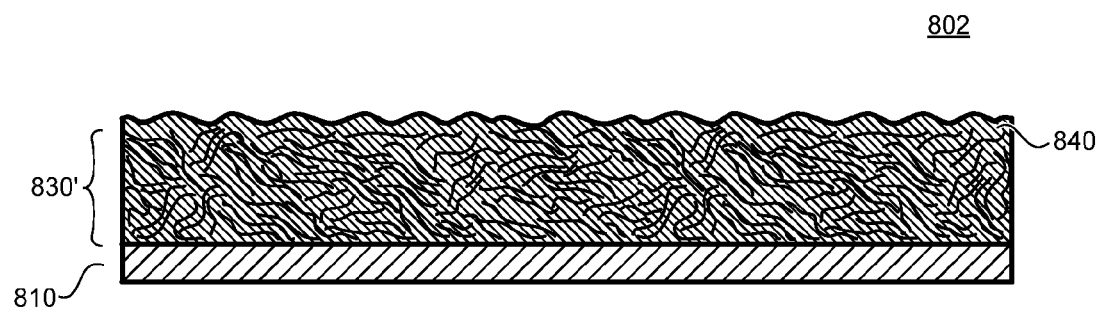
Figure 8D:
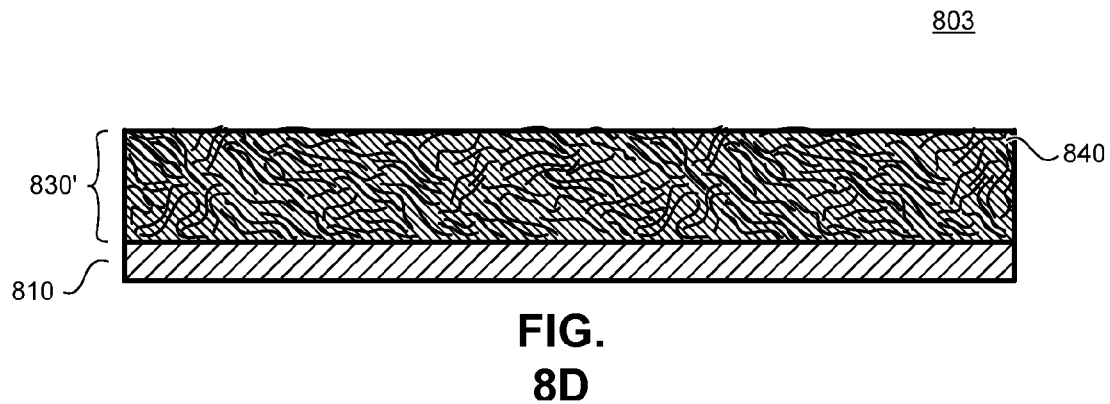

Referring now to FIG. 8A, in a first process step 800 a first conductive layer 810 is provided. Referring now to FIG. 8B, in a second process step 801 a porous nanotube fabric layer 830 is deposited over the first conductive layer 810. Referring now to FIG. 8C, in a third process step 802 a sacrificial material 840—such as, but not limited to, phospho silicate glass (PSG) oxide, spin on glass, a physical vapor deposition (PVD) of germanium, or a sacrificial polymer—is flowed over the porous nanotube fabric layer 830 such that it substantially permeates porous nanotube fabric layer 830. Referring now to FIG. 8D, in a fourth process step 803, the combined nanotube fabric/sacrificial material layer 830' is etched to remove any material overflowing the top of the layer 830'.

It should be noted that while FIG. 8C (and subsequent figures) depicts sacrificial material 840 as essentially completely penetrating nanotube fabric layer 830, the methods of the present disclosure are not limited in this regard. Indeed, as will become evident in the following description of this aspect of the present disclosure, the depth to which the sacrificial material 840 penetrates the nanotube fabric layer 830 is not important so long as the sacrificial material 840 forms a barrier within the nanotube fabric layer which prevents an adjacent material layer from penetrating. Similarly, while FIG. 8C depicts sacrificial material 840 overflowing the nanotube fabric layer (necessitating process step 803 depicted in FIG. 8D), the methods of the present disclosure are not limited in this regard. Indeed, it will be obvious to those skilled in the art that in some applications a sacrificial material could be deposited in such a way that it does not overflow nanotube fabric layer 830, eliminating the need for process step 803.

Figure 8E:
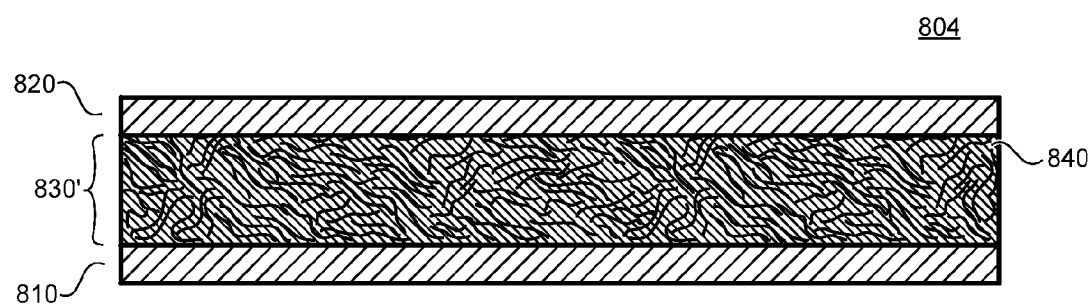

Referring now to FIG. 8E, in a fifth process step 804, a non-hermetic conductive layer 820—that is a conductive layer which is substantially porous, such as, but not limited to, a physical vapor deposition (PVD) of titanium nitride (TiN), tantalum nitride (TaN), a tungsten (W), or a tungsten nitride (WN)—is deposited over the combined nanotube fabric/sacrificial material layer 830'. As the sacrificial material 840 substantially fills in the pores of the original nanotube fabric layer 830, the non-hermetic conductive layer 820 does not seep into the combined nanotube fabric/sacrificial material layer 830'.

Figure 8F:
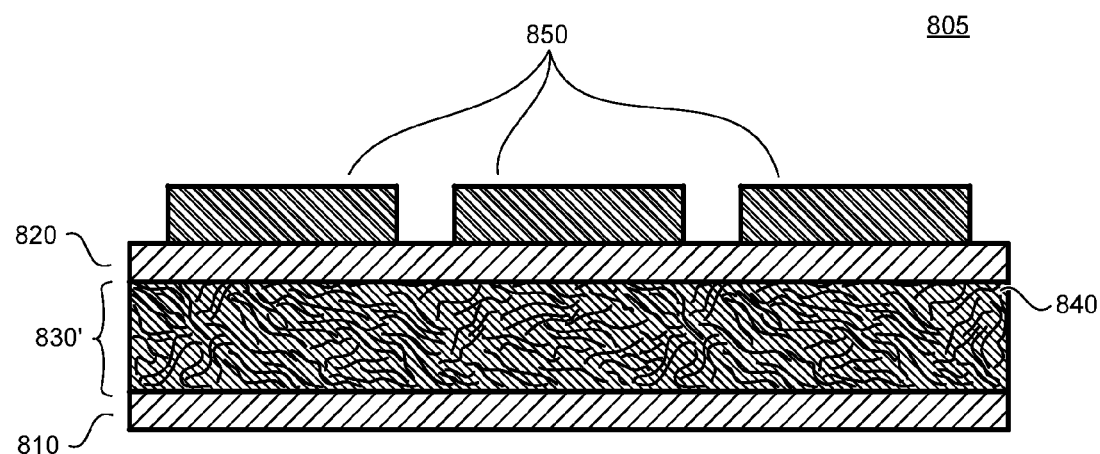
Figure 8G:
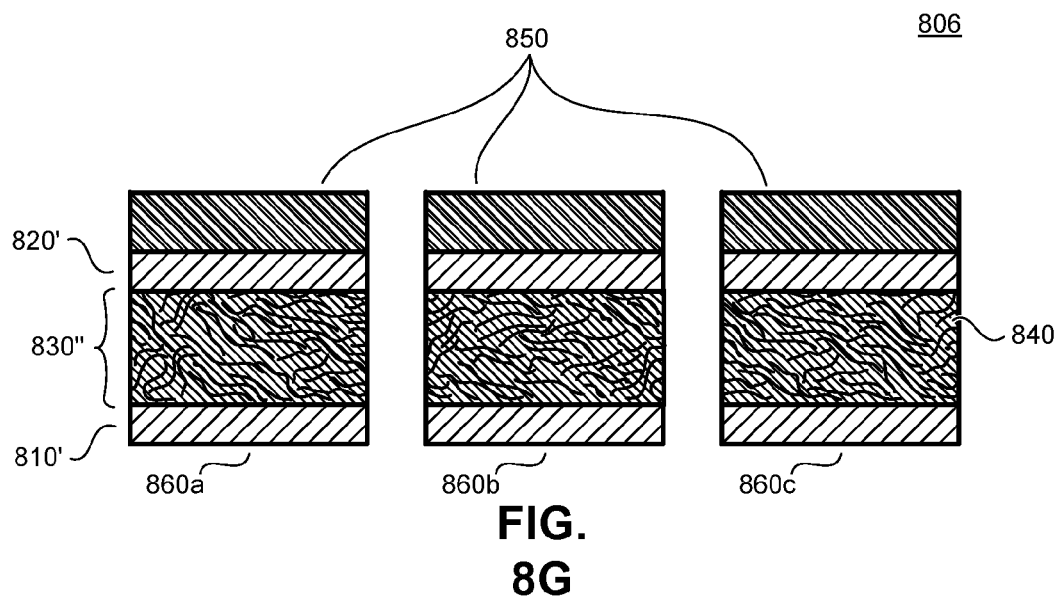
Figure 8H:
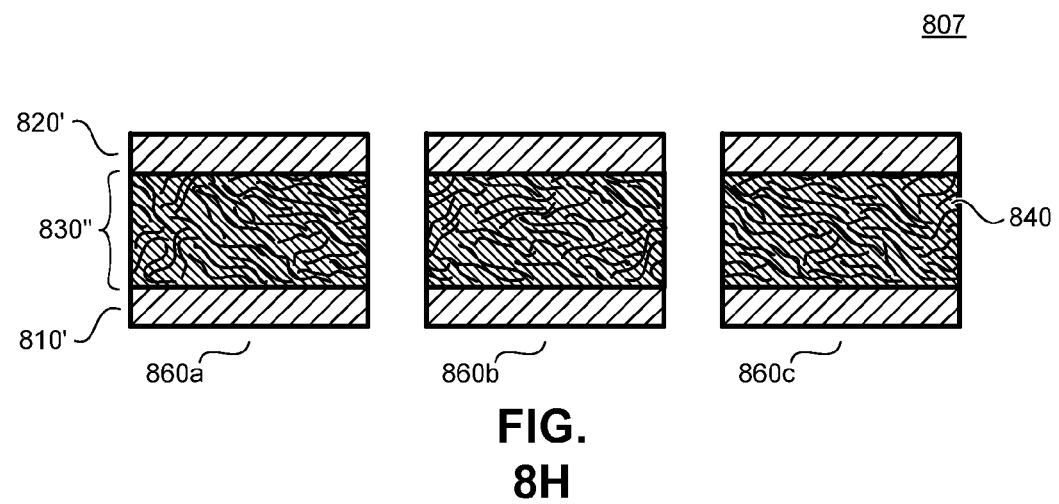

Referring now to FIG. 8F, in a sixth process step 805 a hard mask layer 850—such as, but not limited to, an amorphous carbon layer—is deposited in such a way as to define a plurality of individual two terminal switching devices. Referring now to FIG. 8G, in a seventh process step 806, an etch process is used to remove those portions of first conductive layer 810, combined nanotube fabric/sacrificial material layer 830', and non-hermetic conductive layer 820 not covered by hard mask layer 850. In this way, three individual nanotube switching devices 860a, 860b, and 860c are realized, each comprising a first conductive layer 810', a patterned combined nanotube fabric/sacrificial material layer 830", and a non-hermetic conductive layer 820'. It should be noted that in some embodiments, sacrificial material 840—in addition to passivating the nanotube fabric layer 830 during the fabrication process—may also provide structural integrity to the individual two terminal nanotube switching elements 860a, 860b, and 860c during the fabrication process. Referring now to FIG. 8H, in an eighth process step 807, the hard mask layer (850 in FIG. 8G) is removed.

Figure 8I:
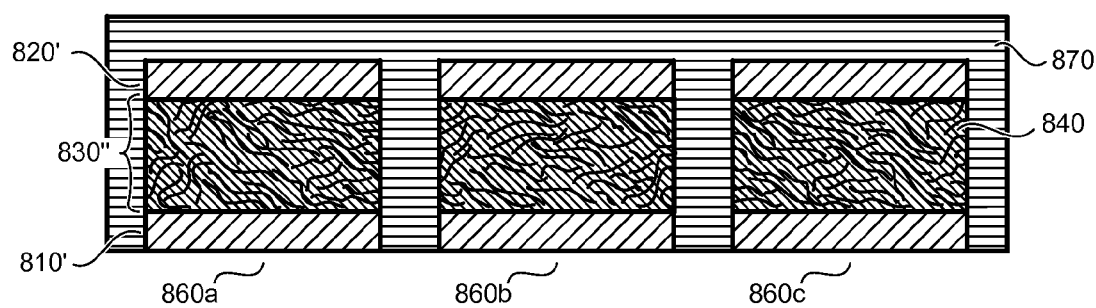

Referring now to FIG. 8I, in an ninth process step 808, a dielectric material 870—such as, but not limited to, silicon nitride (SiN)—is deposited over the individual nanotube switch elements 860a, 860b, and 860c. As the sacrificial material 840 substantially fills in the pores of the original nanotube fabric layer 830, the dielectric material 870 does not encroach into the sides of the combined nanotube fabric/sacrificial material layer 830" within each of the nanotube switching devices 860a, 860b, and 860c.

Figure 8J:
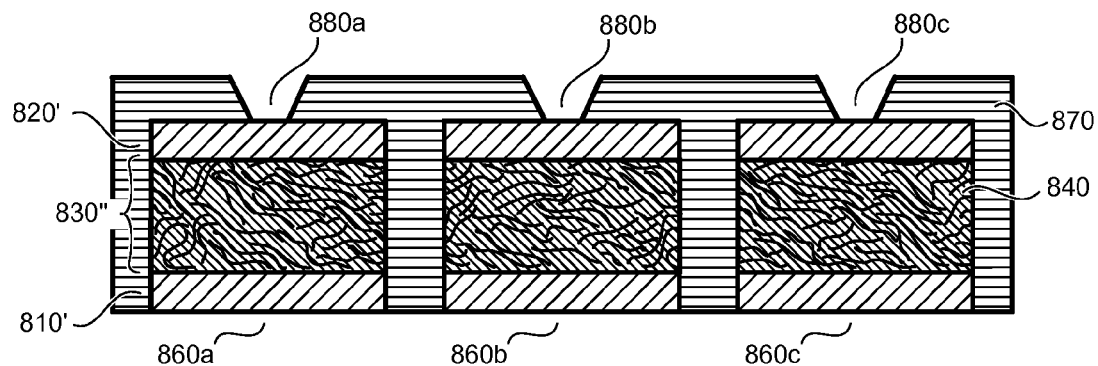
Figure 8K:
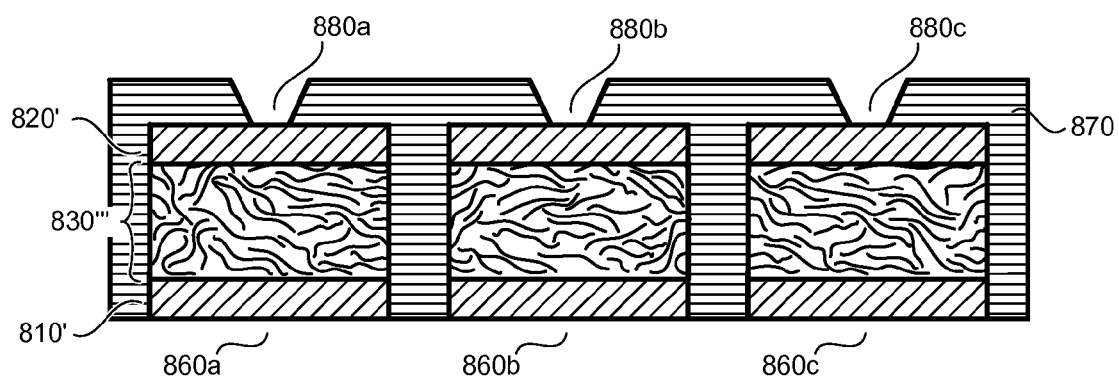

Referring now to FIG. 8J, in a tenth process step 809, a via (880a, 880b, and 880c) is formed through dielectric material 870 over each of the individual nanotube switching elements (860a, 860b, and 860c, respectively) such as to expose the non-hermetic conductive layer 820' of each element. Referring now to FIG. 8K, in a final process step 811, a wet etch process—such as, but not limited to, a hydrofluoric etch—is used to volatize the sacrificial material 840 through the non-hermetic conductive layer 820' within each of the nanotube fabric layers 830" in each of individual nanotube switching elements (860a, 860b, and 860c). The porous nature of the non-hermetic conductive layers 820' allows the wet etch process to access the combined nanotube fabric/sacrificial material layer 830" within each of the individual nanotube switching devices (860a, 860b, and 860c) and dissolve and remove sacrificial material 840. In this way each of the individual nanotube switching devices (860a, 860b, and 860c) is left with a patterned passivated nanotube fabric layer 830'".

In this way, a sacrificial material is flowed over a nanotube fabric layer and is used to passivate—as well as, in some embodiments, provide structural support for—the nanotube fabric layer as it is etched into individual narrow blocks to form a plurality of two terminal nanotube switch elements.

FIGS. 9A-9M illustrate a method of passivating a nanotube fabric layer through the use of a sacrificial filler material wherein the sacrificial material is volatized during the formation of individual two terminal nanotube switching elements.

Figure 9A:
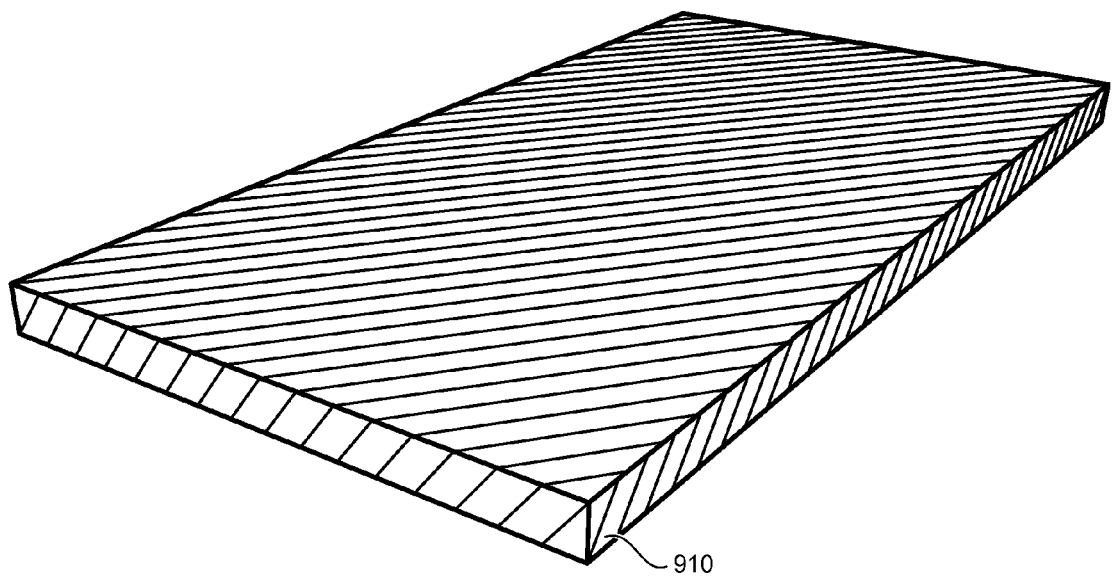
Figure 9C:
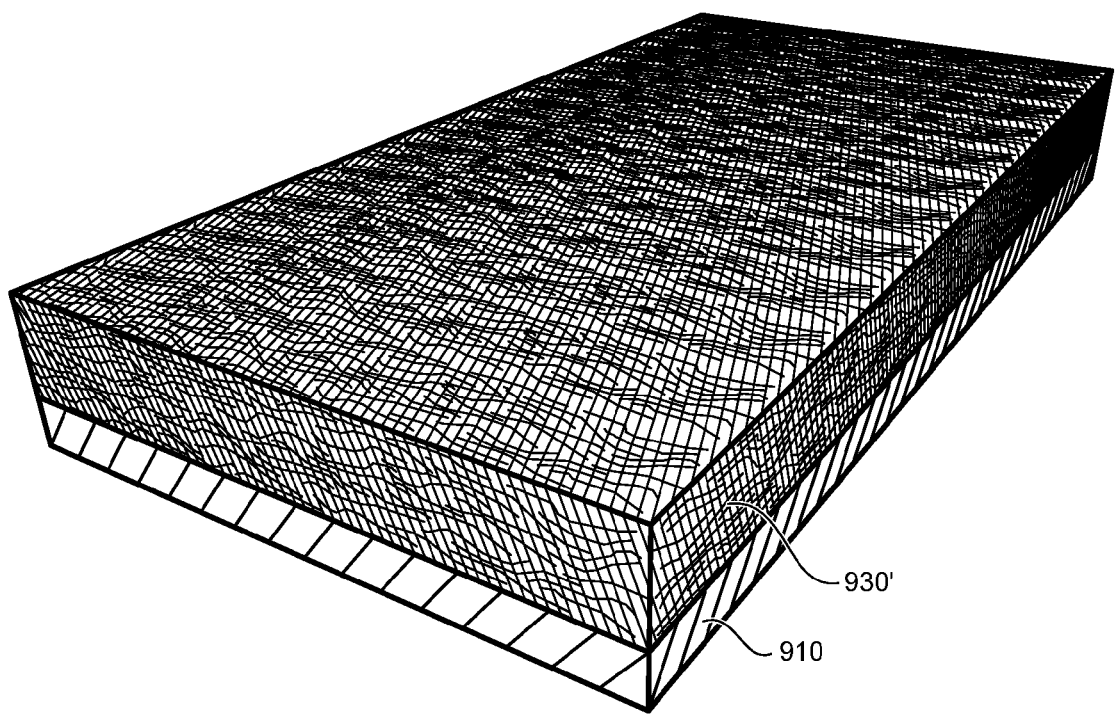

Referring now to FIG. 9A, in a first process step 901 a first conductive layer 910 is provided. Referring now to FIG. 9B, in a second process step 902 a porous nanotube fabric layer 930 is deposited over the first conductive layer 910. Referring now to FIG. 9C, in a third process step 903 a sacrificial material—such as, but not limited to, phospho silicate glass (PSG) oxide, spin on glass, a physical vapor deposition (PVD) of germanium, or a sacrificial polymer—is flowed over the porous nanotube fabric layer 930 such that it substantially permeates porous nanotube fabric layer 930, forming combined nanotube fabric/sacrificial material layer 930'.

It should be noted that while FIG. 9C (and subsequent figures) depicts the sacrificial material as essentially completely penetrating combined nanotube fabric/sacrificial material layer 930', the methods of the present disclosure are not limited in this regard. Indeed, as will become evident in the following description of this aspect of the present disclosure, the depth to which the sacrificial material penetrates the combined nanotube fabric/sacrificial material layer 930 is not important so long as the sacrificial material 940 forms a barrier within the nanotube fabric layer which prevents an adjacent material layer from penetrating.

Referring now to FIG. 9D, in a fourth process step 904, a second conductive layer 920 is deposited over the combined nanotube fabric/sacrificial material layer 930'. As the sacrificial material substantially fills in the pores of the original nanotube fabric layer 930, second conductive layer 920 does not seep into the combined nanotube fabric/sacrificial material layer 930'.

Figure 9E:
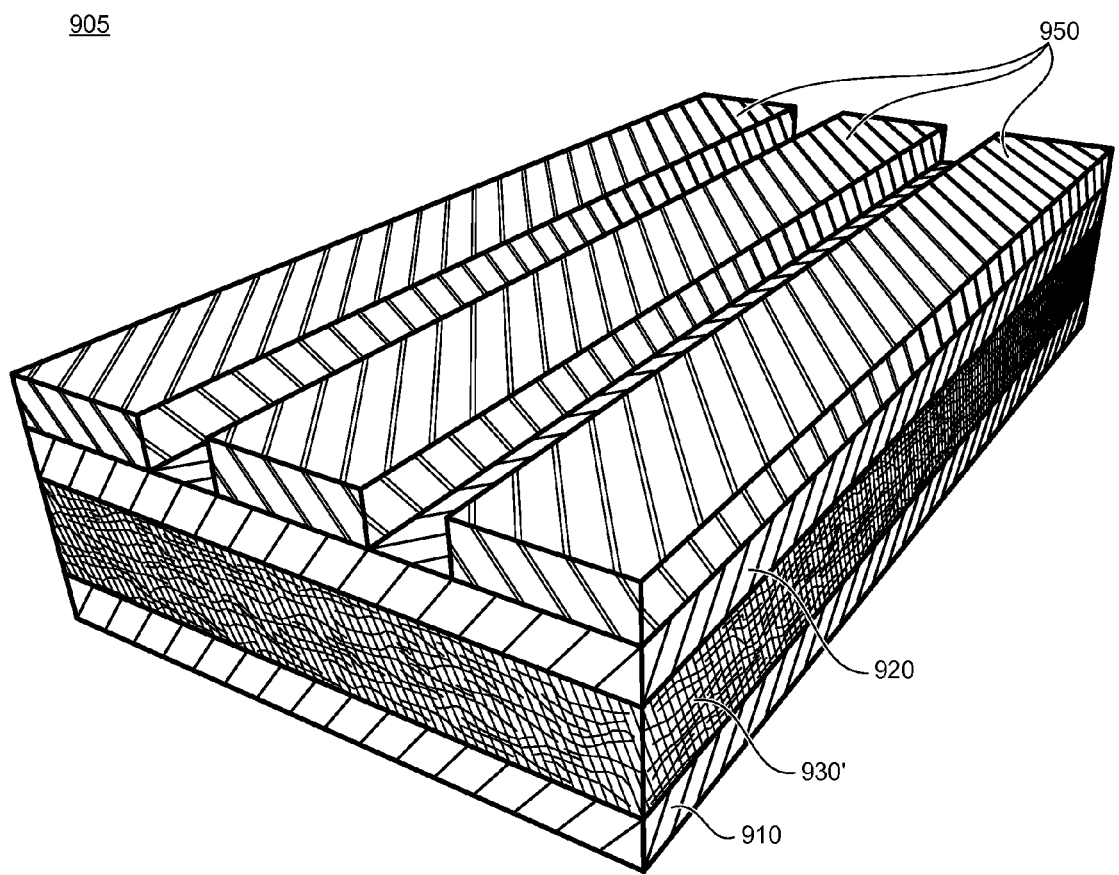
Figure 9F:
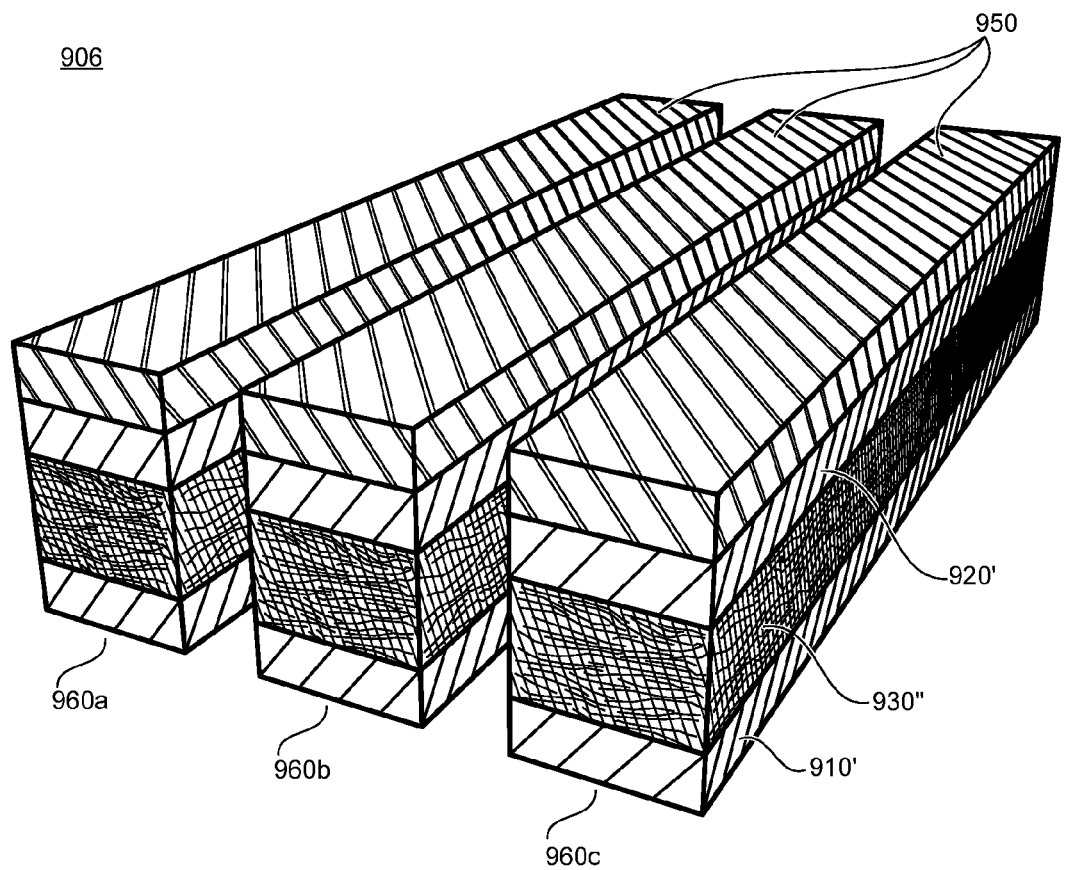

Referring now to FIG. 9E, in a fifth process step 905 a first hard mask layer 950—such as, but not limited to, an amorphous carbon layer—is deposited in such a way as to define a plurality of narrow strips. Referring now to FIG. 9F, in a sixth process step 906, an etch process is used to remove those portions of first conductive layer 910, combined nanotube fabric/sacrificial material layer 930', and second conductive layer 920 not covered by first hard mask layer 950. In this way, three long and narrow strips 960a, 960b, and 960c are realized, each comprising a first conductive layer 910', a patterned combined nanotube fabric/sacrificial material layer 930", and a second conductive layer 920'. It should be noted that in some embodiments, the sacrificial material—in addition to passivating the nanotube fabric layer 930 during the fabrication process—may also provide structural integrity to the intermediate structures formed during the fabrication process (that is, long narrow strips 960a, 960b, and 960c).

Figure 9H:
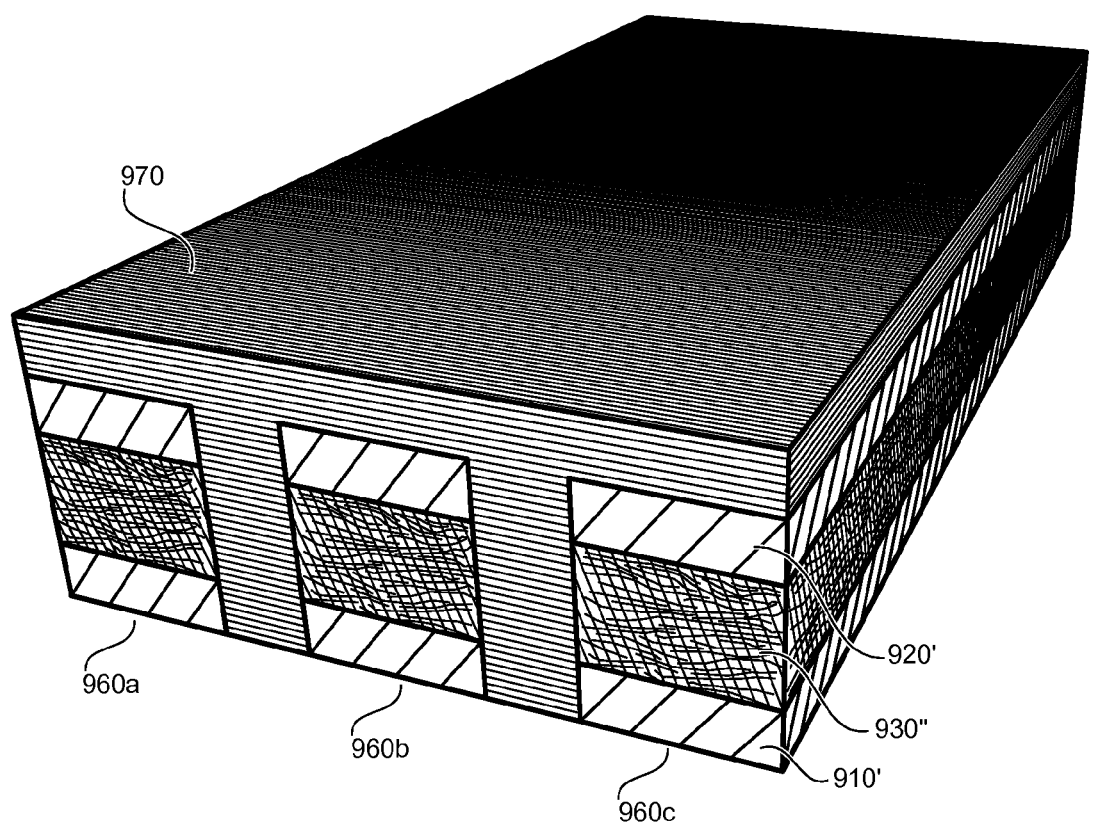

Referring now to FIG. 9G, in a seventh process step 907, the first hard mask layer (950 in FIG. 9F) is removed. Referring now to FIG. 9H, in an eighth process step 908, a dielectric material 970—such as, but not limited to, silicon nitride (SiN)—is deposited over long and narrow strips 960a, 960b, and 960c.

Figure 9I:
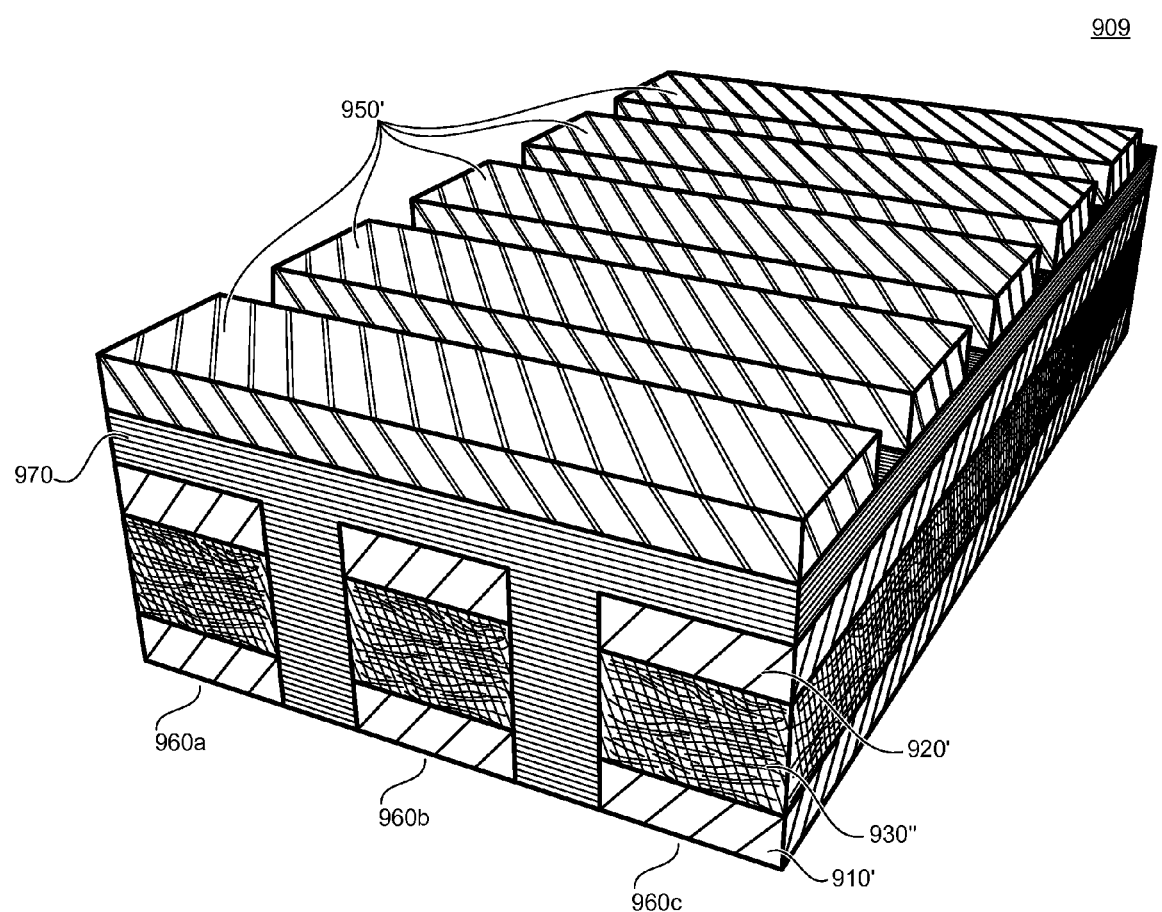
Figure 9J:
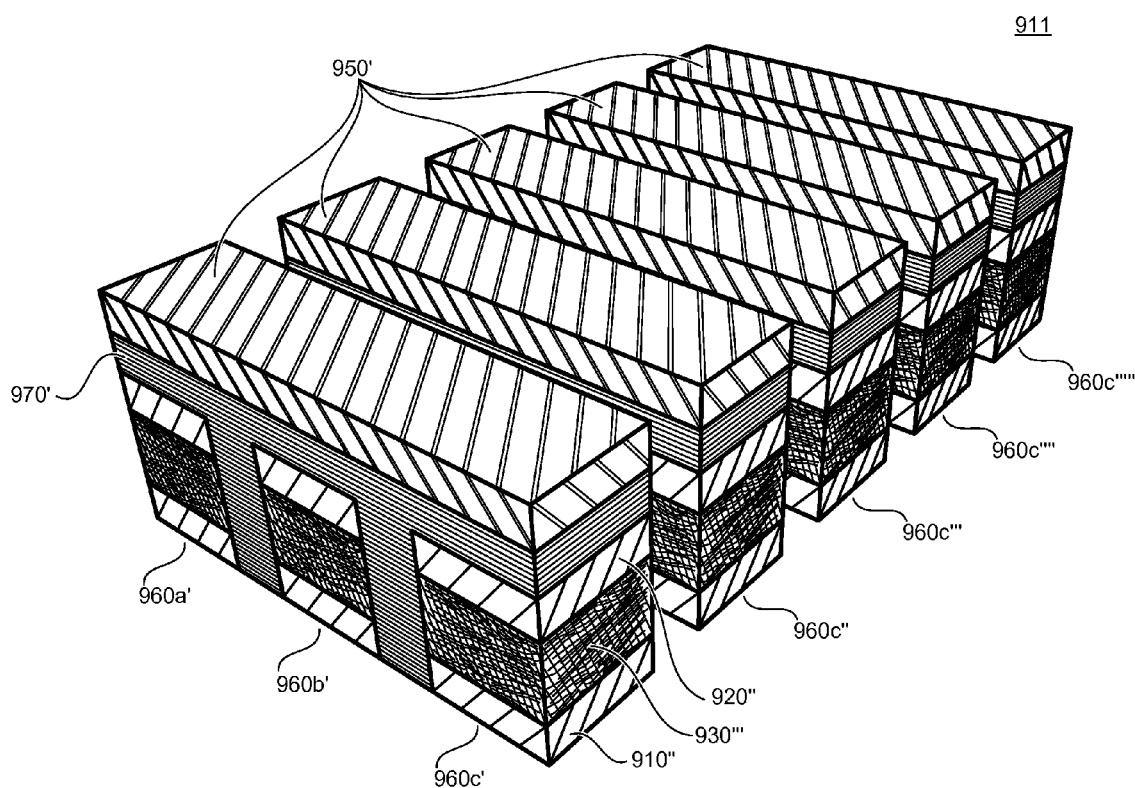

Referring now to FIG. 9I, in a ninth process step 909 a second hard mask layer 950'—such as, but not limited to, an amorphous carbon layer—is deposited in such a way as to define a plurality of individual nanotube switching elements. Referring now to FIG. 9J, in a tenth process step 911, an etch process is used to remove those portions of first conductive layer 910', combined nanotube fabric/sacrificial material layer 930", and second conductive layer 920' not covered by second hard mask layer 950'. In this way, a plurality of individual two terminal nanotube switching elements 960a', 960b', and 960c'-960c'''' (additional nanotube switching elements in line with elements 960a' and 960b' and analogous to elements 960c"-960c'''' are not visible in FIG. 9J, but would be present) are formed from three long and narrow strips 960a, 960b, and 960c, each comprising a first conductive layer 910", a patterned combined nanotube fabric/sacrificial material layer 930"', and a second conductive layer 920'. Each row of two terminal nanotube switching elements 960a', 960b', and 960c'-960c remains coated in a layer of etched dielectric material 970'.

Figure 9K:
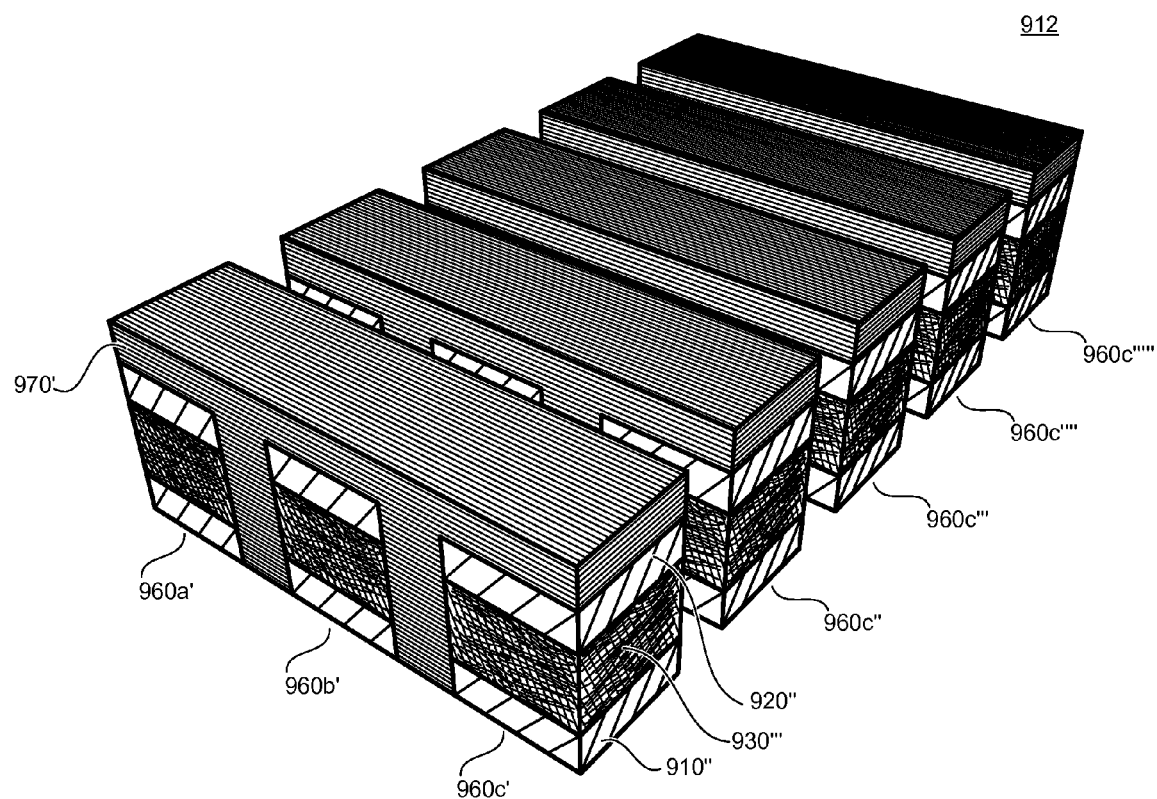

Referring now to FIG. 9K in an eleventh process step 912, the second hard mask layer (950' in FIG. 9J) is removed.

Figure 9L:
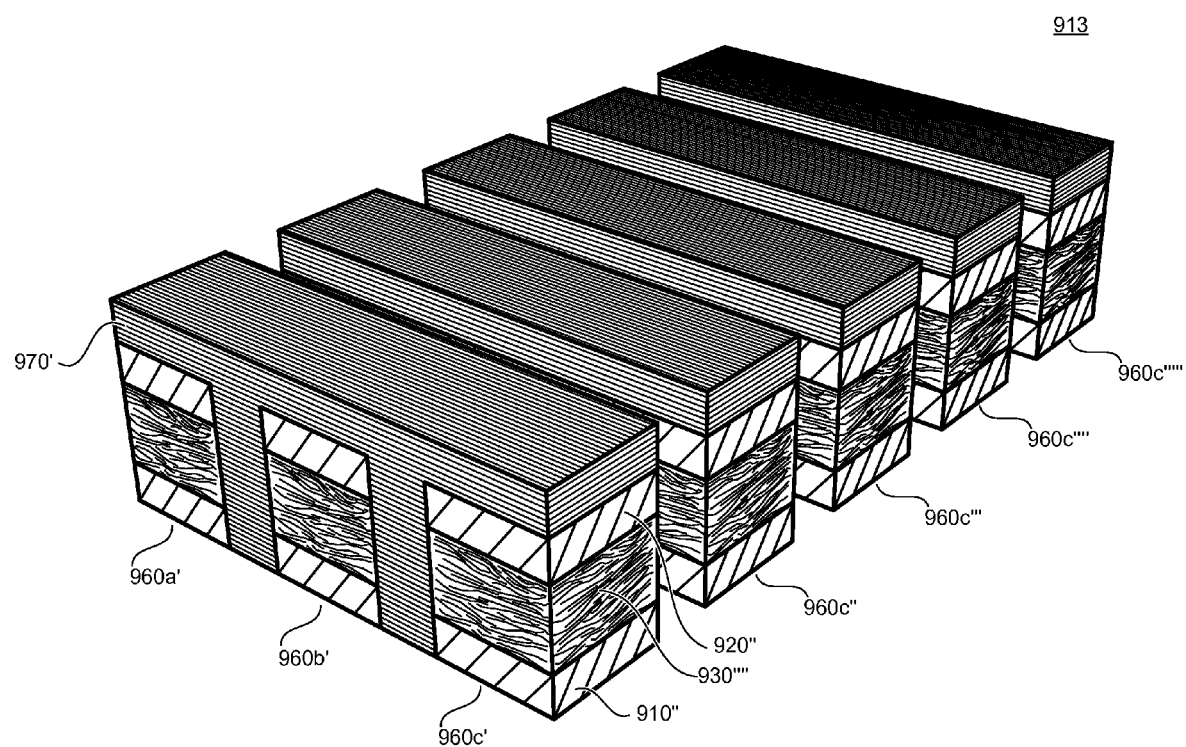

Referring now to FIG. 9L, in a twelfth process step 913, a wet etch process—such as, but not limited to, a hydrofluoric etch—is used to volatize and remove the sacrificial material through the exposed sides of each combined nanotube fabric/sacrificial material layer 930''' in each of individual nanotube switching elements 960a', 960b', and 960c'-960c''''. In this way each of the individual nanotube switching devices (960a', 960b', and 960c'-960c'''') is left with a patterned passivated nanotube fabric layer 930''''.

Referring now to FIG. 9M, in a final process step 914, a dielectric material 970"—such as, but not limited to, silicon nitride (SiN)—is deposited over individual nanotube switching elements 960a', 960b', and 960c'-960c''''.

In this way, a sacrificial material is flowed over a nanotube fabric layer and is used to passivate—as well as, in some embodiments, provide structural support for—the nanotube fabric layer as it is etched into individual narrow blocks to form a plurality of two terminal nanotube switch elements.

Passivation Through the Use of a Non-Sacrificial Material

In another aspect of the present disclosure, a nanotube fabric layer is passivated by using a non-sacrificial filler material. Within this aspect of the present disclosure, a non-sacrificial material is deposited over and allowed to penetrate a porous nanotube fabric layer prior to the deposition of an adjacent material layer. This non-sacrificial material effectively forms a barrier within the nanotube fabric layer, preventing an adjacent material layer from penetrating completely through the nanotube fabric layer during the fabrication process. The non-sacrificial filler material is selected or deposited in such a way as it does not adversely affect the switching function of the nanotube fabric layer. As such, a separate fabrication process step to remove the non-sacrificial material is not required.

FIGS. 10A-10D illustrate a method of passivating a nanotube fabric layer through the use of a non-sacrificial filler material.

Figure 10A:
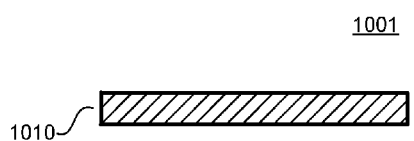
FIGS. 10A-10D are a series of process diagrams which illustrate a method of passivating a nanotube fabric layer through the use of a non-sacrificial filler material.
Figure 10B:
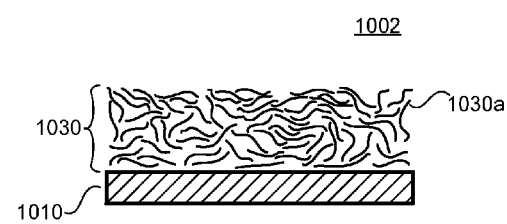
Figure 10C:
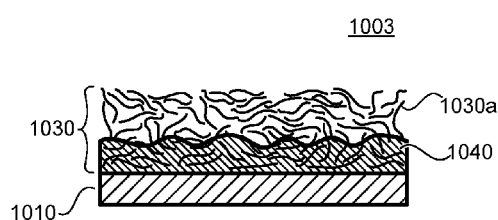

Referring now to FIG. 10A, in a first process step 1001 a first conductive layer 1010 is provided. Referring now to FIG. 10B, in a second process step 1002 a porous nanotube fabric layer 1030 is deposited over the first conductive layer 1010. Referring now to FIG. 10C, in a third process step 1003 a filler material 1040—such as, but not limited to, amorphous carbon, silicon dioxide ($SiO_2$), and silicon nitride (SiN)—is flowed over the porous nanotube fabric layer 1030 such that it flows into and forms a barrier within nanotube fabric layer 1030.

Figure 10D:
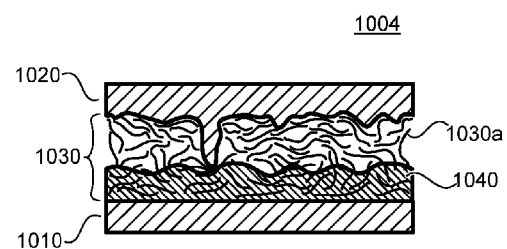

Referring now to FIG. 10D, in a fourth process step 1004, a second conductive layer 1020 is deposited over nanotube fabric layer 1030. While nanotube fabric layer 1030 permits second conductive layer 1020 to seep through the pores and voids present within the porous nanotube fabric layer 1030, the layer of filler material 1040 within the nanotube fabric layer 1030 prevents the second conductive layer 1020 from coming into physical (and electrical) contact with first conductive layer 1010.

It should be noted that while FIGS. 10C and 10D depict filler material 1040 as forming a barrier layer along the bottom of nanotube fabric layer 1030 and adjacent to first conductive layer 1010, the methods of the present disclosure are not limited in this regard. Indeed, as will become evident in the following description of this aspect of the present disclosure, the depth to which the sacrificial material 1040 penetrates the nanotube fabric layer 1030 is not important so long as the filler material 1040 forms a barrier within the nanotube fabric layer which prevents an adjacent material layer from penetrating completely and coming into physical contact with first conductive electrode 1010.

FIGS. 11A-11F illustrate a method of passivating a nanotube fabric layer through the use of a porous dielectric material. The formation and application of a porous dielectric material (such as, but not limited to, silicon dioxide aerogel and porous silica) are well known to those skilled in the art. Typically a dielectric material is infused with particles of a second material (typically an organic material) commonly termed a "porogen" by those skilled in the art. An etching process or an anneal process is typically employed to remove the porogen material after the dielectric material has been deposited, leaving behind a plurality of voids or pores within the formed dielectric material layer.

Figure 11A:
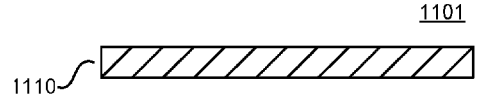
FIGS. 11A-11F are a series of process diagrams which illustrate a method of passivating a nanotube fabric layer through the use of a porous dielectric material.
Figure 11B:
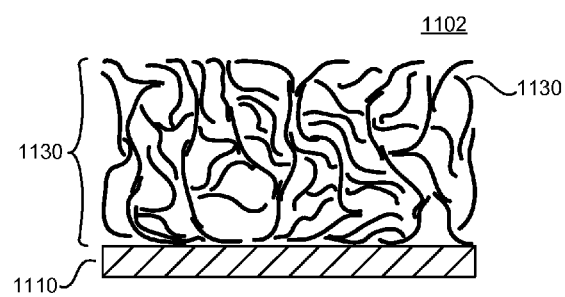
Figure 11C:
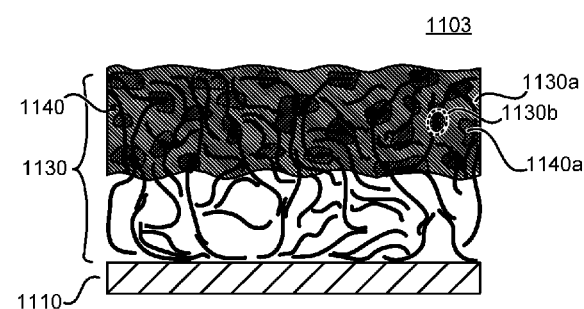
Figure 11D:
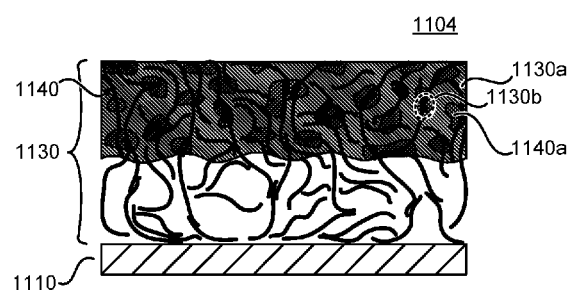

Referring now to FIG. 11A, in a first process step 1101, a first conductive layer 1110 is provided. Referring now to FIG. 11B, in a second process step 1102, a nanotube fabric layer 1130 comprising a plurality of individual nanotube elements 1130a is formed over first conductive layer 1110. Referring now to FIG. 11C, in a third process step 1103, a dielectric material 1140 infused with a plurality of porogens 1140a is applied and allowed to penetrate nanotube fabric layer 1130. Referring now to FIG. 11D, in a fourth process step 1104 the dielectric material layer 1140 is etched to remove any material overflowing the top of nanotube fabric layer 1130.

Figure 11E:
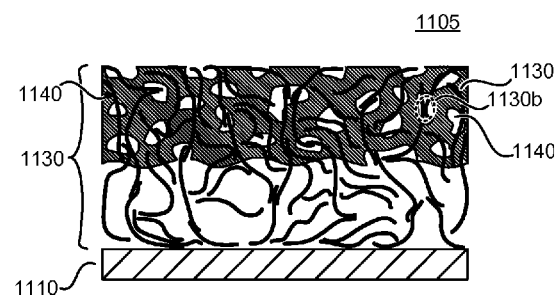
Figure 11F:
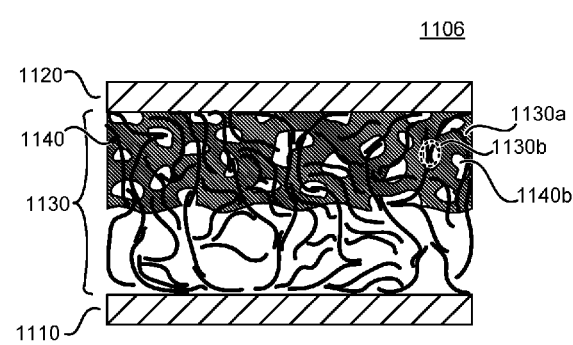

Referring now to FIG. 11E, in a fifth process step 1105 an etching process is used to volatize and remove the plurality of porogens 1140a within porous dielectric material 1140. The volatizing and removal of porogens 1140a within process step 1105 results in a plurality of voids or pores 1140b within porous dielectric material 1140.

In a sixth process step 1106, a second conductive layer 1120 is deposited over the nanotube fabric layer 1130. The porous nanotube fabric layer 1130, now at least partially infused within the porous dielectric material 1140, is substantially passivated, and second conductive layer 1120 does not encroach the nanotube fabric layer 1130.

The plurality of voids 1140b within porous dielectric material 1140 allows for a plurality of individual nanotube junctions 1130b (that is, the areas within the nanotube fabric layer where two or more individual nanotube elements meet) to operate freely. Thus, while the nanotube fabric layer 1130 is substantially passivated and does not permit conductive layer 1120 to penetrate through, the overall switching operation is still able to function within the void areas 1140b.

FIGS. 12A-12F illustrate a method of passivating a nanotube fabric layer through the use of a room temperature chemical vapor deposition (RTCVD) process.

Figure 12A:
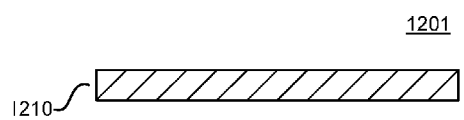
FIGS. 12A-12F are a series of process diagrams which illustrate a method of passivating a nanotube fabric layer through the use of a room temperature chemical vapor deposition (RTCVD) process.
Figure 12B:
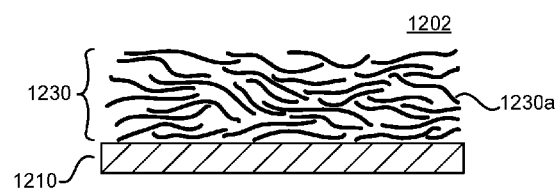
Figure 12C:
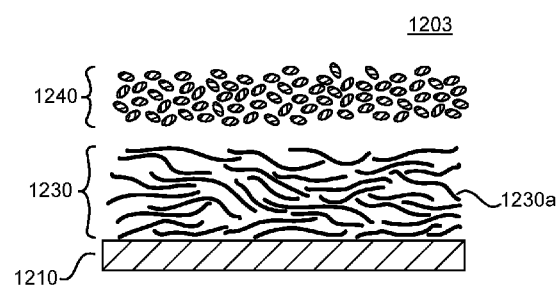
Figure 12D:
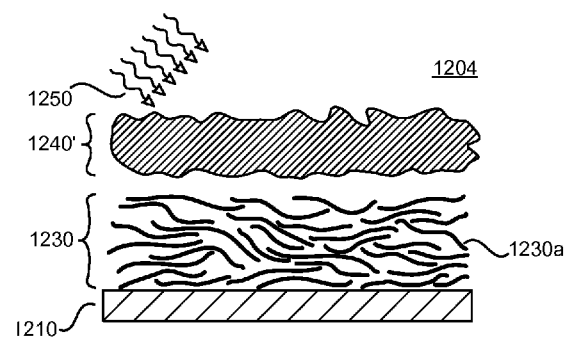

Referring now to FIG. 12A, in a first process step 1201 a first conductive layer 1210 is provided. Referring now to FIG. 12B, in a second process step 1202 a porous nanotube fabric layer 1230 comprising a plurality of individual nanotube elements 1230a is deposited over first conductive layer 1210. Referring now to FIG. 12C, in a third process step 1203 a gaseous filler material 1240—such as, but not limited to, tetraethyl orthosilicate (TEOS)—is flowed over nanotube fabric layer 1240 at room temperature. Referring now to FIG. 12D, in a fourth process step 1204 ultraviolet (UV) radiation 1250 is used to convert the gaseous filler material (1240 in FIG. 12C) into a liquid filler material 1240'.

Figure 12E:
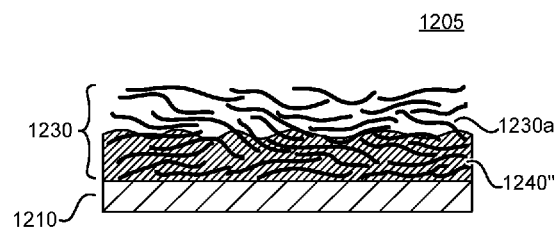

Referring now to FIG. 12E, in a fifth process step 1205 the liquid filler material (1240' in FIG. 12D) is allowed to penetrate nanotube fabric layer 1230, and an anneal process is used to convert the liquid filler material (now in place within the nanotube fabric layer 1230) into a solid state 1240". In this way, a filler material 1240" forms a barrier layer within nanotube fabric layer 1230, essentially passivating nanotube fabric layer 1230 as will be shown in final process step 1206 (depicted in FIG. 12F) below.

Figure 12F:
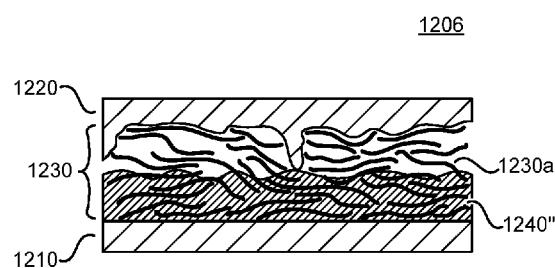

Referring now to FIG. 12F, in a final process step 1206 a second conductive layer 1220 is deposited over nanotube fabric layer 1230. While second conductive layer 1220 penetrates partially through nanotube fabric layer 1230, filler material 1240" prevents it from coming into physical or electrical contact with first conductive layer 1210.

FIGS. 13A-13E illustrate a method of passivating a nanotube fabric layer through the use of a non-directional sputter deposition process.

Figure 13A:
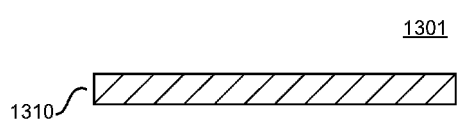
FIGS. 13A-13E are a series of process diagrams which illustrate a method of passivating a nanotube fabric layer through the use of a non-directional sputter deposition process.
Figure 13B:
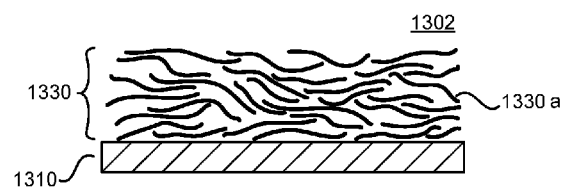
Figure 13C:
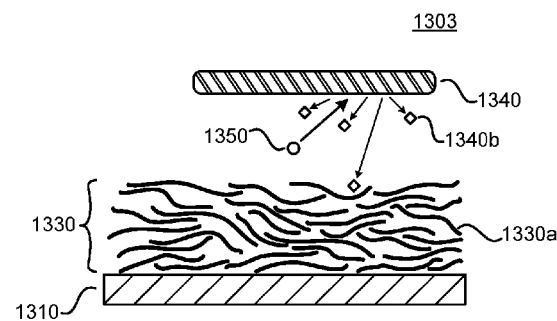

Referring now to FIG. 13A, in a first process step 1301 a first conductive layer 1310 is provided. Referring now to FIG. 13B, in a second process step 1302 a porous nanotube fabric layer 1330 comprising a plurality of individual nanotube elements 1330a is deposited over first conductive layer 1310. Referring now to FIG. 13C, in a third process step 1303 filler material particles 1340b are deposited over the top of nanotube fabric layer 1330 via a non-directional sputter deposition process.

Sputter deposition processes are well known to those skilled in the art. As depicted in exemplary process step 1303 in FIG. 13C, a wafer of filler material 1340—such as, but not limited to, titanium nitride (TiN)—is bombarded with ions 1350—such as, but not limited to argon (Ar). This bombardment ejects particles 1340b (or in some cases individual atoms) of the filler material 1340. In a typical directional sputter process, an electric field is used to direct the trajectory of the ejected filler material particles 1340b. For example, a typical directional sputter process might apply an electric field over the nanotube fabric layer 1330 such that the ejected filler material particles 1340b impacted the nanotube fabric layer substantially perpendicular to the layer itself. In this way, a substantial number of the filler material particles 1340b could be expected to penetrate through the porous nanotube fabric layer 1330.

Within the methods of the present disclosure, however, a non-directional sputter deposition process is used. That is, the ejected filler material particles 1340b are allowed to fly away from the filler material wafer 1340 in random trajectories. In this way, very few of the ejected filler material particles 1340b will penetrate the porous nanotube fabric layer 1330 and most of the ejected filler material particles 1340b will simply form a layer over the top surface of nanotube fabric layer 1330.

Figure 13D:
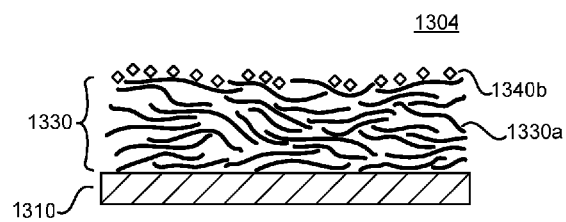
Figure 13E:
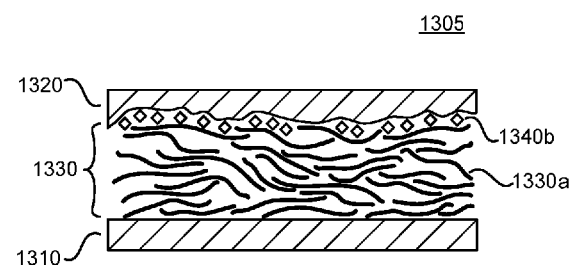

Referring now to FIG. 13D, in a fourth process step 1304 this top layer of ejected filler material particles 1340b can be seen covering the top of nanotube fabric layer 1330. Referring now to FIG. 13E, in a final process step 1305 a second conductive layer 1320 is deposited over nanotube fabric layer 1330. The layer of ejected filler material particles 1340b serve to limit the encroachment of the second conductive layer 1320, preventing the layer from seeping into nanotube fabric layer 1330 and coming into physical or electrical contact with first conductive layer 1310.

In this way nanotube fabric layer 1330 is passivated with a layer of filler material particles 1340b deposited via a non-directional sputter deposition process, preventing the encroachment of an adjacent material layer 1320 while preserving the switching function of the nanotube fabric layer 1330 itself.

Passivation Through the Use of Nanoscopic Particles to Limit the Porosity of the Nanotube Fabric Layer In another aspect of the present disclosure, a passivated nanotube fabric layer is comprised of a first plurality of individual nanotube elements and a second plurality of nanoscopic particles. The nanoscopic particles limit the overall porosity of the nanotube fabric layer—which limits the degree to which an adjacent material layer can penetrate the nanotube fabric layer—while preserving the switching function of the nanotube fabric layer itself. In this way, the overall density of a nanotube fabric layer can be increased without increasing the density of the individual nanotube elements.

Figure 14:
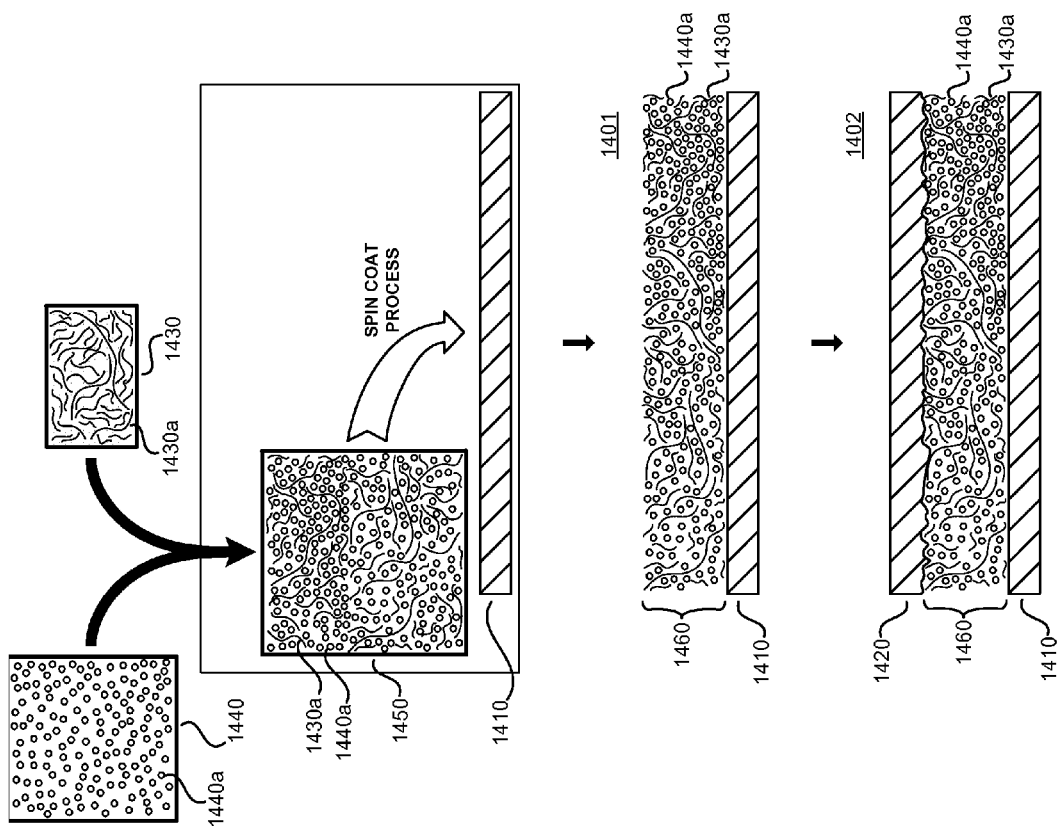
FIG. 14 is a process diagram illustrating a the formation of a passivated two terminal nanotube switching device which includes a nanotube fabric layer which comprises both individual nanotube elements and nanoscopic particles.

FIG. 14 illustrates the formation of a two terminal nanotube switching devices including a nanotube fabric layer which comprises both individual nanotube elements and nanoscopic particles. A first volume 1430 of individual nanotube elements 1430a is combined with a second volume 1440 of nanoscopic particles 1440a to form an application solution 1450 which comprises both individual nanotube elements 1430a and nanoscopic particles 1440a. Specific values for the first volume 1430 and the second volume 1440 are selected such that a desired ratio of individual nanotube elements 1430a to nanoscopic particles 1440a is realized. For instance, in one non-limiting example an optimal ratio of individual nanotube elements 1430a to nanoscopic particles 1440a for the formation of two terminal nanotube switching devices would be 1:1.

In some embodiments it may be desirable to combine both the individual nanotube elements 1430a and the nanoscopic particles 1440a into a liquid medium such as, but not limited to, water to form application solution 1450. Once combined, the volume of the liquid medium can then be adjusted as to provide a specific concentration (that is the ratio of individual nanotube elements and nanoscopic particles to liquid) optimal for the application of said solution 1450 over first conductive layer 1410 to form a combined nanotube fabric/nanoscopic particle layer 1460 (as depicted by structure 1401). Further, in some embodiments application solution 1450 is applied to first conductive layer 1410 via a spin coating process. However, the methods of the present disclosure are not limited in this regard. Indeed, application solution 1450 could be applied through a plurality of methods including, but not limited to, spray coating.

As depicted in structure 1401, application solution 1450 is deposited over first conductive layer 1410 to form composite switching layer 1460. Within the methods of the present disclosure, nanoscopic particles 1440a serve to limit the porosity between individual nanotube elements 1430a within composite switching layer 1460. As such, as second conductive layer 1420 is applied over composite switching layer 1460—resulting in structure 1402—the encroachment of second conductive layer 1420 into composite switching layer 1460 is significantly limited, preventing second conductive layer 1420 from seeping through composite switching layer 1460 and making physical or electrical contact with first conductive layer 1410.

In one embodiment of this aspect of the present disclosure, nanoscopic particles 1440a are a colloidal dispersion of inert (that is, non-conductive) silica particles. However, the methods of the present disclosure are not limited in this regard. Indeed, nanoscopic particles 1440a can take a plurality of forms depending on the needs of an application or structure in which the methods of the present disclosure are employed. The nanoscopic particles 1440a may be spherical, oblong, square, irregular, or any other shapes as would be readily apparent to those skilled in the art. The nanoscopic particles 1440a may have at least one dimension that is in the nanometer size. For example, the nanoscopic particles 1440a may have at least one dimension which is less than 1000 nm, 500 nm, 400 nm, 300 nm, 200 nm, 100 nm, 50 nm, 40 nm, 30 nm, 20 nm, 10 nm, 5 nm, or 1 nm. In certain embodiments, the nanoscopic particles 1440a may be individual atoms, molecules, or ions.

Nanoscopic particles 1440a can interact covalently or non-covalently to another nanoscopic material, for example, carbon nanotubes. In certain embodiments, the nanoscopic particles 1440a may be miscible with the nanotube elements 1430a and form a continuous material around the individual nanotube elements 1430a. In some other embodiments, the nanoscopic particles 1440a may be inert to the nanotube elements 1430a and remain in the same form as initially introduced into the mixture 1450 and therefore non-miscible. In yet some other embodiments, the nanoscopic particles 1440a may be partially miscible with the nanotube elements 1430a and form a semi-miscible mixture with the nanotubes.

Furthermore, in certain embodiments, the choice of such nanoscopic particles 1440a can include a material or materials that can be formed with a uniform particle size. In certain applications, the choice of a nanoscopic particle can include a material or materials which can be fabricated as individual particles within certain dimensions. For example, an application may require a nanoscopic particle wherein individual particles are not larger than some fraction of a device feature size.

The choice of such nanoscopic particles can include any material or materials which do not adversely affect the switching operation (that is, the changing from one nominal nonvolatile resistive state to another) of the composite article. In fact, in certain embodiments, the nanoscopic particles 1440a may improve switching operation by lowering the voltage needed for the composite article to change its resistance.

In some other embodiments, inorganic nanoparticles can be utilized. For example, silicon based materials (such as, but not limited to silicon oxide and silicon nitride) can be used for said nanoscopic particles 1440a.

In some embodiments, one or more non-conductive allotropes of carbon (such as, but not limited to, diamond, carbon black, and fullerenes) can be used for said nanoscopic particles 1440a.

In certain embodiments, nanoscopic particles 1440a can include a mixture of different nanoscopic materials, such as any combination of nanoscopic particles 1440a described above.

The nanoscopic particles 1440a can be obtained by numerous different ways. For example, carbon particles having substantially uniform volume can be obtained through the process described below. Methods for obtaining other desired nanoscopic materials 1440a will be readily apparent to those skilled in the art.

In a first processing step, reacting a volume of carbon black material with an oxidizing agent (such as, but not limited to, nitric acid) to form a carbon slurry in order to decrease the size of carbon black particles and further remove any metallic contaminants (via solubilization). The first processing step may be aided by further introducing other acids, such as hydrochloric acid.

In a next processing step, filtering the carbon slurry formed in the first process step at low pH (for example, but not limited to, via cross-flow membranes) to remove any solubilized impurities In a next processing step, increasing pH level of the carbon slurry to realize a homogeneous and stable colloidal system (in some operations, a sonication In a next processing step, filtering the realized homogeneous and stable colloidal system through a train of filters to remove any particles which could lead to defects in the spin coated film (in some operations, for example, said system would be passed through filters with pores as small as 10 nm or 5 nm or other filters with the smallest pore size available)

FIGS. 15A-15F illustrate a method of further passivating a nanotube fabric layer comprised of individual nanotube elements and nanoscopic particles through the use of a room temperature chemical vapor deposition (RTCVD) process.

Figure 15A:
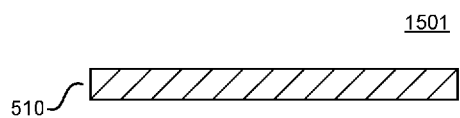
FIGS. 15A-15F is a process diagram illustrating a method of further passivating a nanotube fabric layer comprised of individual nanotube elements and nanoscopic particles through the use of a room temperature chemical vapor deposition (RTCVD) process.
Figure 15B:
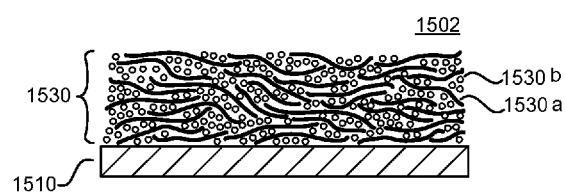
Figure 15C:
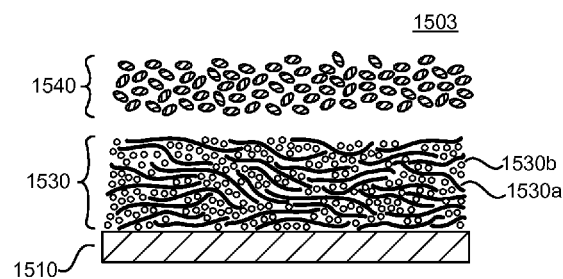
Figure 15D:
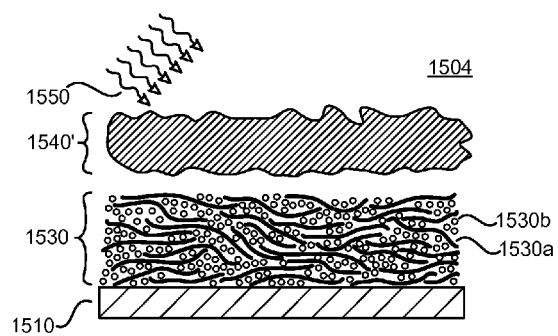

Referring now to FIG. 15A, in a first process step 1501 a first conductive layer 1510 is provided. Referring now to FIG. 15B, in a second process step 1502 a porous composite switching layer 1530 comprising a first plurality of individual nanotube elements 1530a and a second plurality of nanoscopic particles 1530b is deposited over first conductive layer 1510. Referring now to FIG. 15C, in a third process step 1503 a gaseous filler material 1540—such as, but not limited to, tetraethyl orthosilicate (TEOS)—is flowed over composite switching layer 1530 at room temperature. Referring now to FIG. 15D, in a fourth process step 1504 ultraviolet (UV) radiation 1550 is used to convert the gaseous filler material (1540 in FIG. 15C) into a liquid filler material 1540'.

Figure 15E:
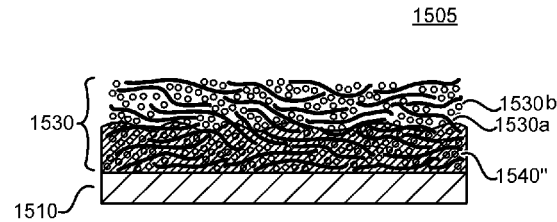

Referring now to FIG. 15E, in a fifth process step 1505 the liquid filler material (1540' in FIG. 15D) is allowed to penetrate composite switching layer 1530, and an anneal process is used to convert the liquid filler material (now in place within the composite switching layer 1530) into a solid state 1540". In this way, a filler material 1540" forms a barrier layer within composite switching layer 1530, essentially passivating composite switching layer 1530 as will be shown in final process step 1506 (depicted in FIG. 15F) below.

Figure 15F:
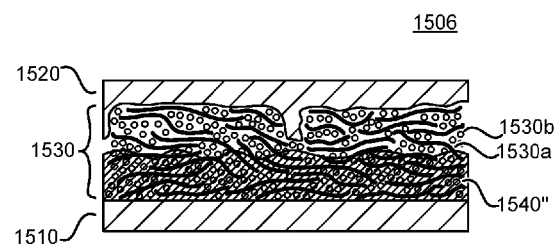

Referring now to FIG. 15F, in a final process step 1506 a second conductive layer 1520 is deposited over composite switching layer 1530. While second conductive layer 1520 penetrates partially through composite switching layer 1530, this encroachment is limited by the presence of nanoscopic particles 1530b (as described in the discussion of FIG. 14 above), and the barrier formed by filler material 1540" further prevents second conductive layer 1520 from coming into physical or electrical contact with first conductive layer 1510.

FIGS. 16A-16E illustrate a method of further passivating a nanotube fabric layer comprising individual nanotube elements and nanoscopic particles through the use of a non-directional sputter deposition process.

Figure 16A:
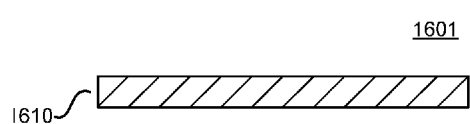
FIGS. 16A-16E is a process diagram illustrating a method of further passivating a nanotube fabric layer comprising individual nanotube elements and nanoscopic particles through the use of a non-directional sputter deposition process.
Figure 16B:
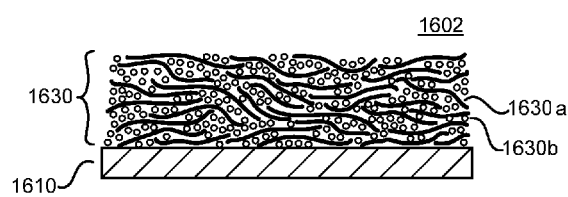

Referring now to FIG. 16A, in a first process step 1601 a first conductive layer 1610 is provided. Referring now to FIG. 16B, in a second process step 1602 a porous composite switching layer 1630 comprising a first plurality of individual nanotube elements 1630a and a second plurality of nanoscopic particles 1630b is deposited over first conductive layer 1610.

Figure 16C:
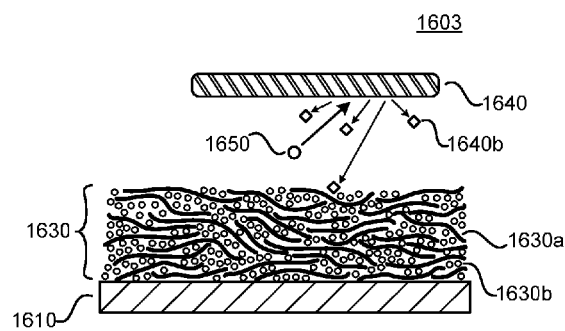

Referring now to FIG. 16C, in a third process step 1603 filler material particles 1640b are deposited over the top of composite switching layer 1630 via a non-directional sputter deposition process.

As discussed in the detailed description of FIGS. 13A-13E, sputter deposition processes are well known to those skilled in the art. A wafer of filler material 1640—such as, but not limited to, titanium nitride (TiN)—is bombarded with ions 1650—such as, but not limited to argon (Ar). This bombardment ejects particles 1640a (or in some cases individual atoms) of the filler material 1640. In a typical directional sputter process, an electric field is used to direct the trajectory of the ejected filler material particles 1640b. For example, a typical directional sputter process might apply an electric field over the composite switching layer 1630 such that the ejected filler material particles 1640b impacted the nanotube fabric layer substantially perpendicular to the layer itself. In this way, a substantial number of the filler material particles 1640b could be expected to penetrate through the porous composite switching layer 1630.

Within the methods of the present disclosure, however, a non-directional sputter deposition process is used. That is, the ejected filler material particles 1640b are allowed to fly away from the filler material wafer 1640 in random trajectories. In this way, very few of the ejected filler material particles 1640b will penetrate the porous composite switching layer 1630 and most of the ejected filler material particles 1640b will simply form a layer over the top surface of composite switching layer 1630.

Figure 16D:
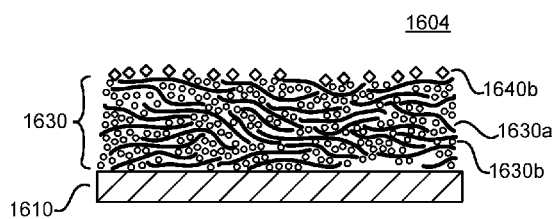
Figure 16E:
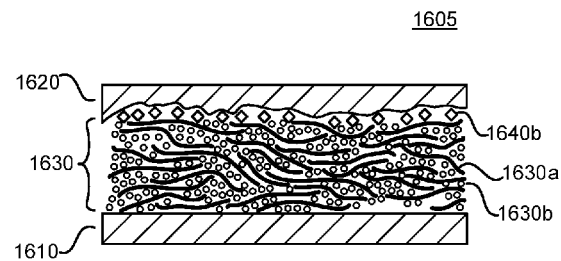

Referring now to FIG. 16D, in a fourth process step 1604 this top layer of ejected filler material particles 1640b can be seen covering the top of composite switching layer 1630. Referring now to FIG. 16E, in a final process step 1605 a second conductive layer 1620 is deposited over composite switching layer 1630. While second conductive layer 1620 penetrates partially through composite switching layer 1630, this encroachment is limited by the presence of nanoscopic particles 1630b (as described in the discussion of FIG. 14 above), the layer of ejected filler material particles 1640b further serves to limit the encroachment of second conductive layer 1620, preventing the layer from seeping into composite switching layer 1630 and coming into physical or electrical contact with first conductive layer 1610.

In this way composite switching layer 1630 is passivated with a layer of filler material particles 1640b deposited via a non-directional sputter deposition process, preventing the encroachment of an adjacent material layer 1620 while preserving the switching function of the composite switching layer 1630 itself.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method for forming a carbonic nanolayer based device, comprising:
   combining a first volume of carbon structures and a second volume of nanoscopic particles in a liquid medium to form an application solution;
   depositing said application solution over a first material layer as to form a composite layer, said composite layer comprising a mixture of said carbon structures and said nanoscopic particles;
   depositing a second material layer such that said composite layer and said second material layer have longitudinal axes that are substantially parallel; and
   flowing a filler material over said composite layer such that said filler material penetrates said composite layer to form a barrier layer.

2. The method of claim 1 wherein said carbon structures are selected from the group consisting of single wall carbon nanotubes, multi-wall carbon nanotubes, functionalized carbon nanotubes, oxidized carbon nanotubes, buckyballs, graphene sheets, nanoscopic graphene flecks, and graphene oxide.

3. The method of claim 1 wherein said second volume of nanoscopic particles are comprised of at least one material selected from the group consisting of silicon oxide, silicon nitride, amorphous carbon, and multi-walled carbon nanotubes.

4. The method of claim 1 wherein substantially all of said nanoscopic particles within said second volume fall within a predetermined volume tolerance.

5. The method of claim 1 wherein at least one of the magnitude of said first volume of carbon structures, the magnitude of said second volume of nanoscopic particles, and the volume of said liquid medium is selected to obtain a desired degree of porosity within said composite layer.

6. The method of claim 1 wherein said first volume of carbon structures form a matrix phase and said second volume of nanoscopic particles form a discrete phase.

7. The method of claim 1 wherein said second volume of nanoscopic particles form a matrix phase and said first volume of carbon structures form a discrete phase.

8. The method of claim 1 wherein said first volume of carbon structures and said second volume of nanoscopic particles form interconnected matrix phases.

9. The method of claim 1 wherein said composite layer has less than about $10^{11}$ metal atoms/cm$^2$.

10. The method of claim 1 wherein said barrier layer limits the encroachment of said material layer into said composite layer.

11. The method of claim 1 further comprising etching away excess filler material after said flowing.

12. The method of claim 1 wherein said barrier layer provides structural support to said composite layer.

13. The method of claim 1 wherein said filler material is selected from the group consisting of amorphous carbon, silicon dioxide ($SiO_2$), and silicon nitride (SiN).

14. The method of claim 1 wherein said barrier layer is formed through a room temperature physical vapor deposition (RTPVD) process.

15. The method of claim 14 wherein said filler material comprises tetraethyl orthosilicate (TEOS).

16. The method of claim 1 wherein said barrier layer is formed through a non-directional sputter deposition process.

17. The method of claim 16 wherein said filler material comprises titanium nitride (TiN).

18. The method of claim 1 wherein at least one of said first material layer and said second material layer are flexible.

* * * * *